US012641814B2

(12) United States Patent
Shin et al.

(10) Patent No.: US 12,641,814 B2
(45) Date of Patent: May 26, 2026

(54) SEMICONDUCTOR DEVICE

(71) Applicant: SAMSUNG ELECTRONICS CO., LTD., Suwon-si (KR)

(72) Inventors: Jongmin Shin, Suwon-si (KR); Wook Hyun Kwon, Suwon-si (KR); Su-Hyeon Kim, Suwon-si (KR); Jun Mo Park, Suwon-si (KR); Kyu Bong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 316 days.

(21) Appl. No.: 18/201,878

(22) Filed: May 25, 2023

(65) Prior Publication Data

US 2024/0136430 A1 Apr. 25, 2024
US 2024/0234558 A9 Jul. 11, 2024

(30) Foreign Application Priority Data

Oct. 21, 2022 (KR) ........................ 10-2022-0136341

(51) Int. Cl.
| | |
|---|---|
| *H01L 29/775* | (2006.01) |
| *H01L 27/088* | (2006.01) |
| *H01L 29/06* | (2006.01) |
| *H01L 29/423* | (2006.01) |
| *H10D 30/43* | (2025.01) |
| *H10D 30/67* | (2025.01) |
| *H10D 62/10* | (2025.01) |
| *H10D 84/83* | (2025.01) |

(52) U.S. Cl.
CPC ......... *H10D 30/43* (2025.01); *H10D 30/6735* (2025.01); *H10D 62/121* (2025.01); *H10D 84/83* (2025.01)

(58) Field of Classification Search
CPC .. H10D 30/43; H10D 30/6735; H10D 62/121; H10D 84/83; H10D 30/014; H10D 30/6757; H10D 62/151; H10D 30/6713; H10D 84/853
USPC ........................................................ 257/401
See application file for complete search history.

(56) References Cited

U.S. PATENT DOCUMENTS

| | | | |
|---|---|---|---|
| 7,402,483 | B2 | 7/2008 | Yun et al. |
| 10,332,970 | B2 | 6/2019 | Vellianitis et al. |
| 10,424,580 | B2 | 9/2019 | Cappellani et al. |
| | | (Continued) | |

FOREIGN PATENT DOCUMENTS

| | | |
|---|---|---|
| KR | 10-2017-0065241 A | 6/2017 |
| KR | 1020220113231 A | 8/2022 |

*Primary Examiner* — Tong-Ho Kim
(74) *Attorney, Agent, or Firm* — Muir Patent Law, PLLC

(57) ABSTRACT

A semiconductor device includes a first active pattern including a first lower pattern and first sheet patterns; a second active pattern including a second lower pattern and second sheet patterns, a height of the second lower pattern being smaller than a height of the first lower pattern; a first gate structure on the first lower pattern; a second gate structure on the second lower pattern; a first source/drain pattern on the first lower pattern and connected to the first sheet patterns; and a second source/drain pattern on the second lower pattern and connected to the second sheet patterns, wherein a width of an upper surface of the first lower pattern is different from a width of an upper surface of the second lower pattern, and wherein a number of first sheet patterns is different from a number of second sheet patterns.

6 Claims, 32 Drawing Sheets

(56)     References Cited

U.S. PATENT DOCUMENTS

| 11,315,934 | B2 | 4/2022 | Zheng et al. | |
| 2020/0083041 | A1 | 3/2020 | Lee et al. | |
| 2020/0105756 | A1 | 4/2020 | Crum et al. | |
| 2021/0098473 | A1* | 4/2021 | Lin | H10D 62/021 |
| 2021/0233909 | A1 | 7/2021 | Bao et al. | |
| 2021/0296317 | A1 | 9/2021 | Ohtou et al. | |
| 2022/0254776 | A1* | 8/2022 | Cheng | H10D 62/121 |

* cited by examiner

SEMICONDUCTOR DEVICE

CROSS-REFERENCE TO RELATED APPLICATION

This application claims priority from Korean Patent Application No. 10-2022-0136341 filed on Oct. 21, 2022 in the Korean Intellectual Property Office, and all the benefits accruing therefrom under 35 U.S.C. 119, the contents of which in its entirety are herein incorporated by reference.

BACKGROUND

1. Field

Embodiments relate to a semiconductor device.

2. Description of Related Art

As one of scaling technologies for increasing a density of the semiconductor device, a multi gate transistor in which a multi-channel active pattern (or a silicon body) having a fin or nanowire shape is formed on a substrate and a gate is formed on a surface of the multi-channel active pattern has been considered.

SUMMARY

The embodiments may be realized by providing a semiconductor device including a first active pattern including a first lower pattern extending in a first direction, and a plurality of first sheet patterns spaced apart from the first lower pattern in a vertical direction; a second active pattern including a second lower pattern extending in the first direction, and a plurality of second sheet patterns spaced apart from the second lower pattern in the vertical direction, a height of the second lower pattern in the vertical direction being smaller than a height of the first lower pattern in the vertical direction; a first gate structure on the first lower pattern and including a first gate electrode extending in a second direction that crosses the first direction; a second gate structure on the second lower pattern and including a second gate electrode extending in the second direction; a first source/drain pattern on the first lower pattern and connected to the plurality of first sheet patterns; and a second source/drain pattern on the second lower pattern and connected to the plurality of second sheet patterns, wherein a width of an upper surface of the first lower pattern in the second direction is different from a width of an upper surface of the second lower pattern in the second direction, and wherein a number of first sheet patterns in the plurality of first sheet patterns is different from a number of second sheet patterns in the plurality of second sheet patterns.

The embodiments may be realized by providing a semiconductor device including a first active pattern including a first lower pattern extending in a first direction, and a plurality of first sheet patterns spaced apart from the first lower pattern in a vertical direction; a second active pattern including a second lower pattern extending in the first direction, and a plurality of second sheet patterns spaced apart from the second lower pattern in the vertical direction, a width of an upper surface of the second lower pattern in a second direction that crosses the first direction is greater than a width of an upper surface of the first lower pattern in the second direction; a first gate structure on the first lower pattern and including a first gate electrode extending in the second direction; a second gate structure on the second lower pattern and including a second gate electrode extending in the second direction; a first source/drain pattern on the first lower pattern and connected to the plurality of first sheet patterns; and a second source/drain pattern on the second lower pattern and connected to the plurality of second sheet patterns, wherein a number of first sheet patterns in the plurality of first sheet patterns is smaller than a number of second sheet patterns in the plurality of second sheet patterns.

The embodiments may be realized by providing a semiconductor device including a first active pattern including a first lower pattern extending in a first direction, and a plurality of first sheet patterns spaced apart from the first lower pattern in a vertical direction, the first lower pattern being defined by a first fin trench; a second active pattern including a second lower pattern extending in the first direction, and a plurality of second sheet patterns spaced apart from the second lower pattern in the vertical direction, the second lower pattern being defined by a second fin trench, and a width of an upper surface of the second lower pattern in a second direction that crosses the first direction is different from a width of an upper surface of the first lower pattern in the second direction; a first gate structure on the first lower pattern and including a first gate electrode extending in the second direction; a second gate structure on the second lower pattern and including a second gate electrode extending in the second direction; a first source/drain pattern on the first lower pattern and connected to the plurality of first sheet patterns; and a second source/drain pattern on the second lower pattern and connected to the plurality of second sheet patterns, wherein number of first sheet patterns in the plurality of first sheet patterns is different from a number of second sheet patterns in the plurality of second sheet patterns, the plurality of first sheet patterns includes a first uppermost sheet pattern, the plurality of second sheet patterns includes a second uppermost sheet pattern, and a height from a bottom surface of the first fin trench to an upper surface of the first uppermost sheet pattern in the vertical direction is equal to a height from a bottom surface of the second fin trench to an upper surface of the second uppermost sheet pattern in the vertical direction.

BRIEF DESCRIPTION OF THE DRAWINGS

Features will be apparent to those of skill in the art by describing in detail exemplary embodiments with reference to the attached drawings in which.

DETAILED DESCRIPTION

A semiconductor device according to some embodiments may include a fin-type transistor (FinFET), a tunneling transistor (tunneling FET), a 3-dimensional (3D) transistor, or a vertical transistor (vertical FET). A semiconductor device according to some embodiments may include a planar transistor. In addition, the technical idea of the present disclosure may be applied to a transistor (2D material-based FET) based on a 2D material, or a heterostructure thereof.

Further, the semiconductor device according to some embodiments may include a bipolar junction transistor, a LDMOS (lateral double diffused metal oxide semiconductor) transistor, or the like.

With reference to FIG. 1 to FIG. 5, descriptions will be made of a semiconductor device according to some embodiments.

Figure 1:
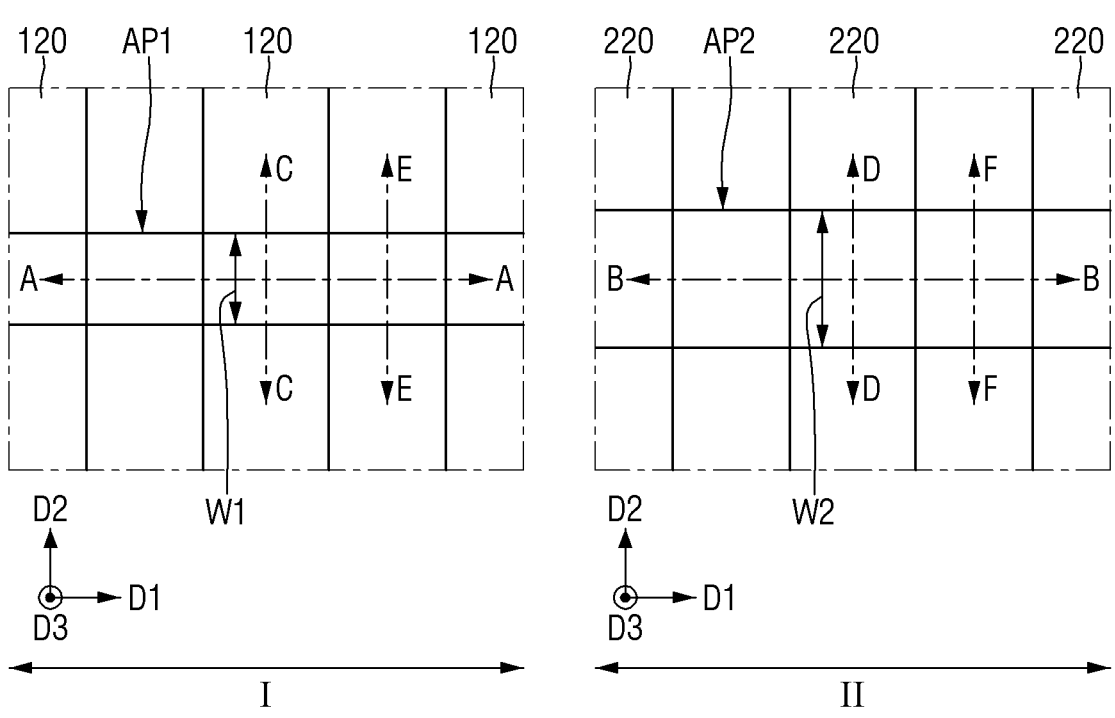
FIG. 1 is an illustrative layout diagram for illustrating a semiconductor device according to some embodiments.
Figure 2:
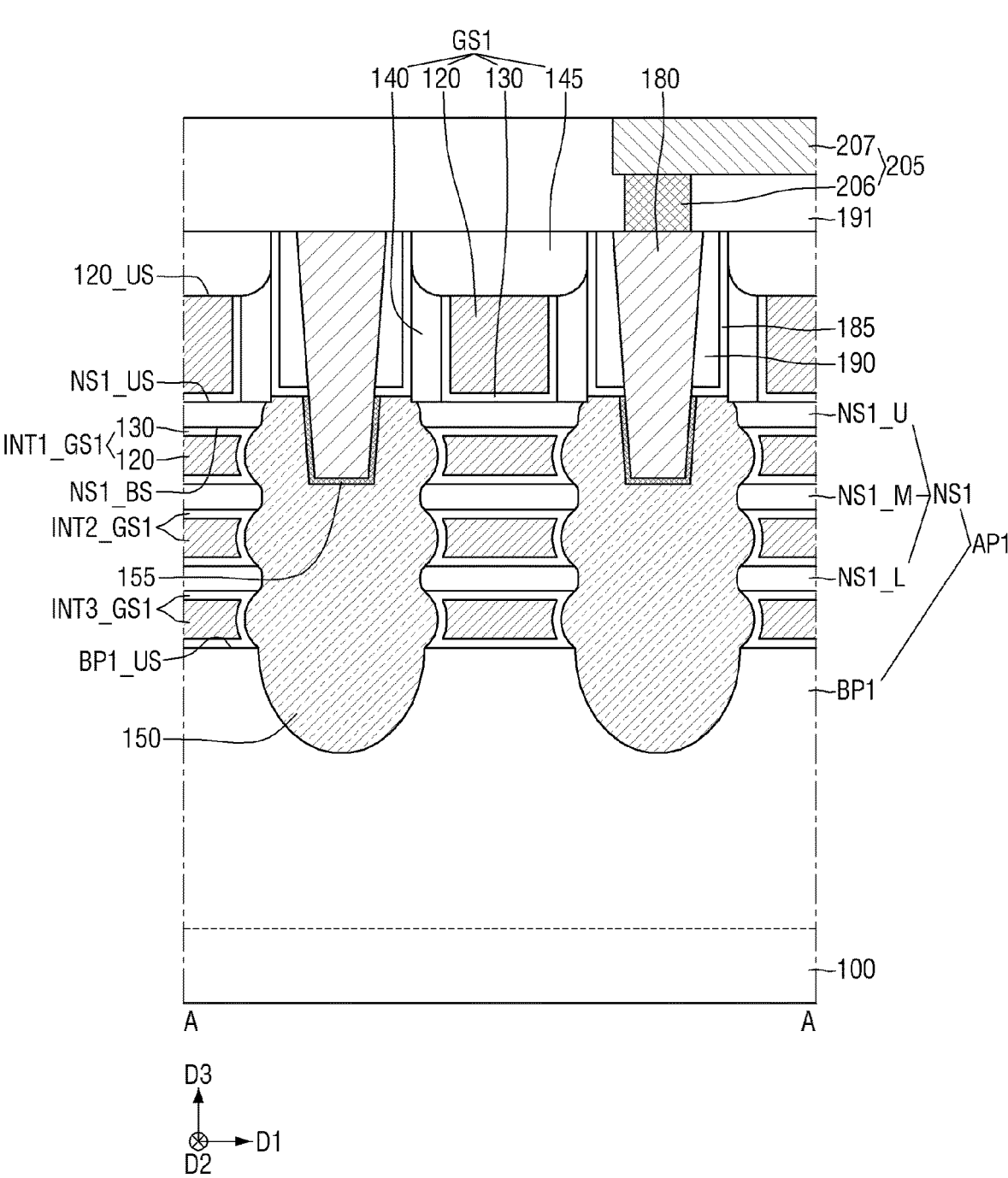
FIG. 2 is a cross-sectional view taken along A-A of FIG. 1.
Figure 3:
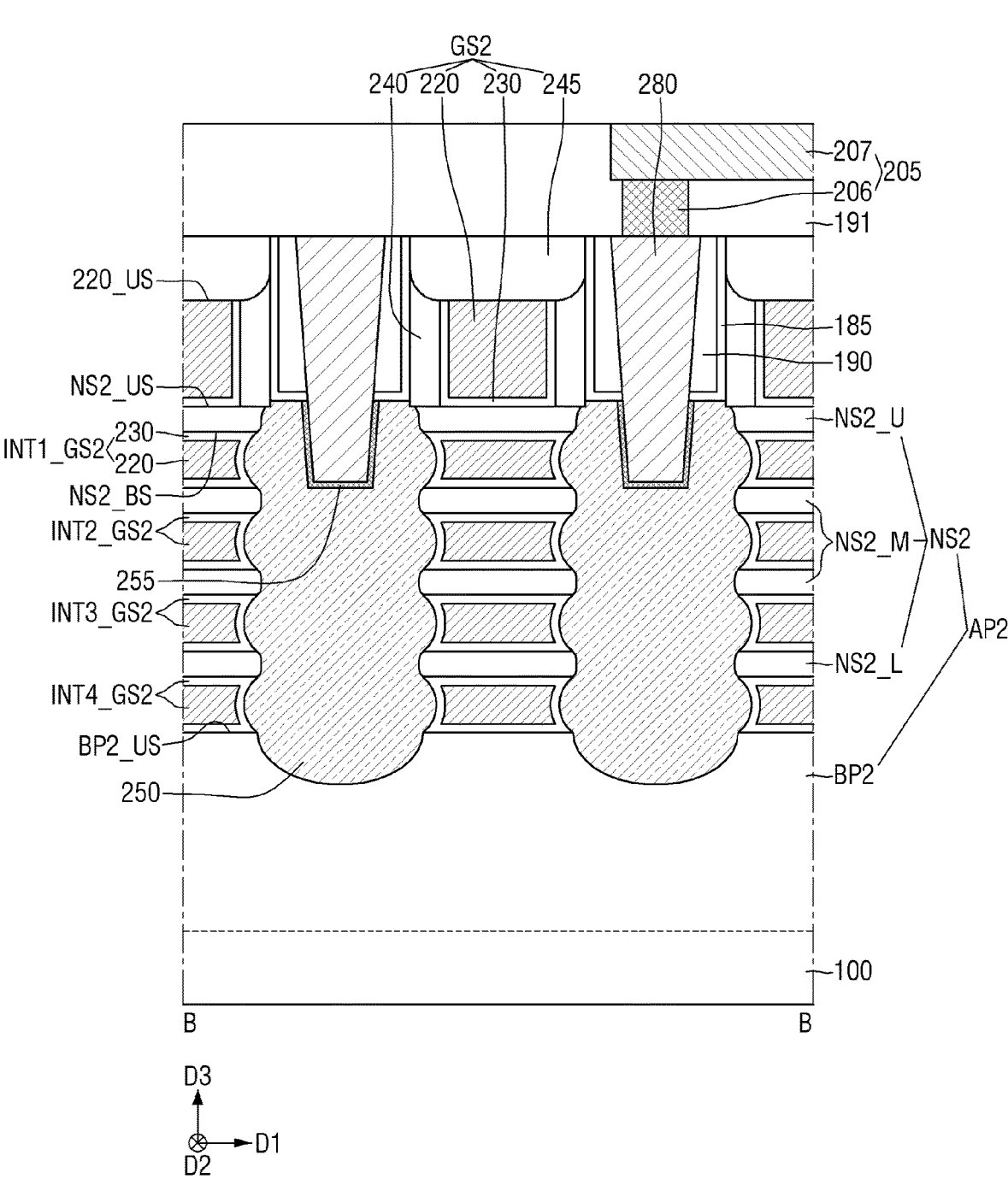
FIG. 3 is a cross-sectional view taken along B-B of FIG. 1.
Figure 4:
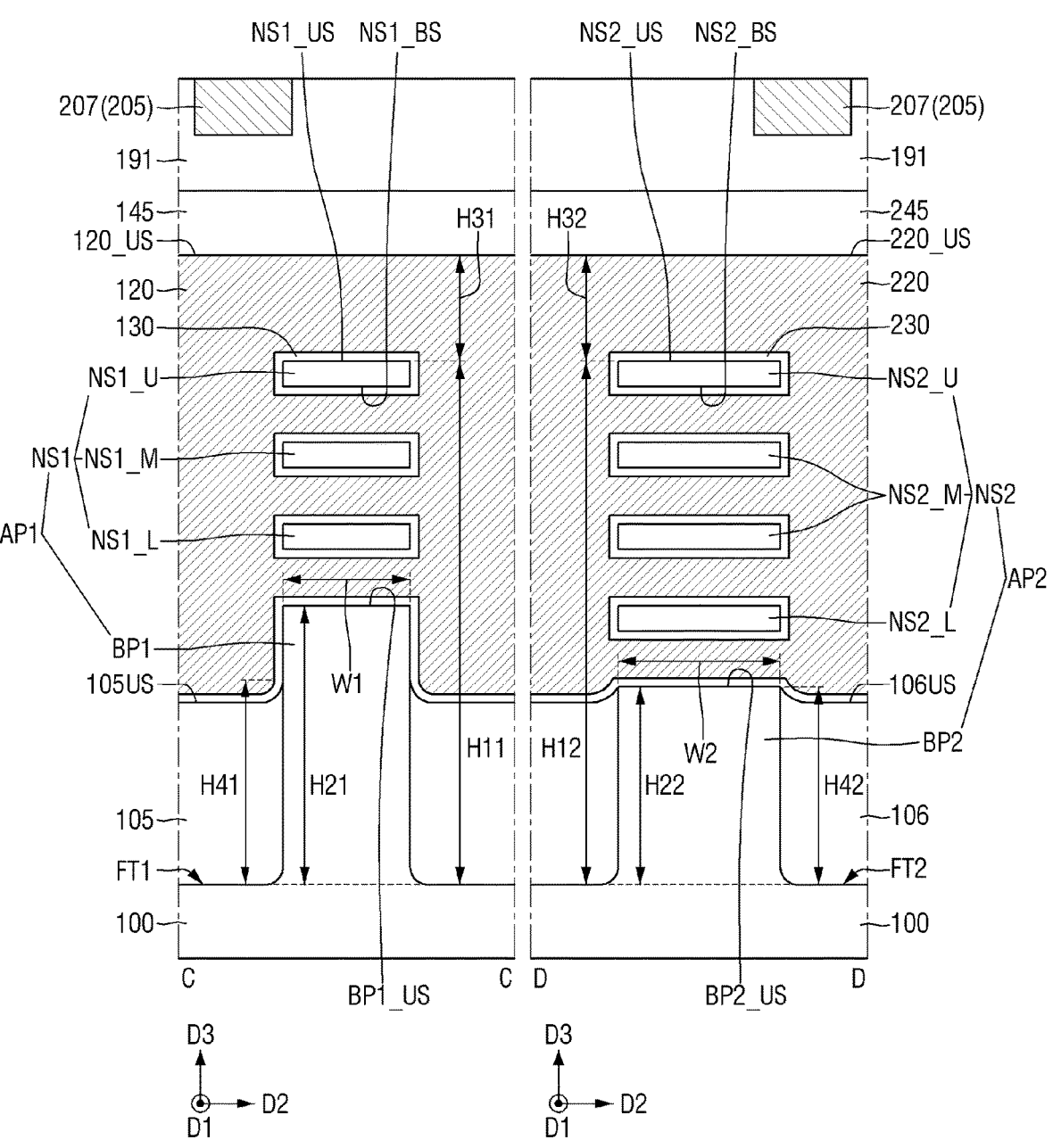
FIG. 4 is a cross-sectional view taken along C-C and D-D of FIG. 1.
Figure 5:
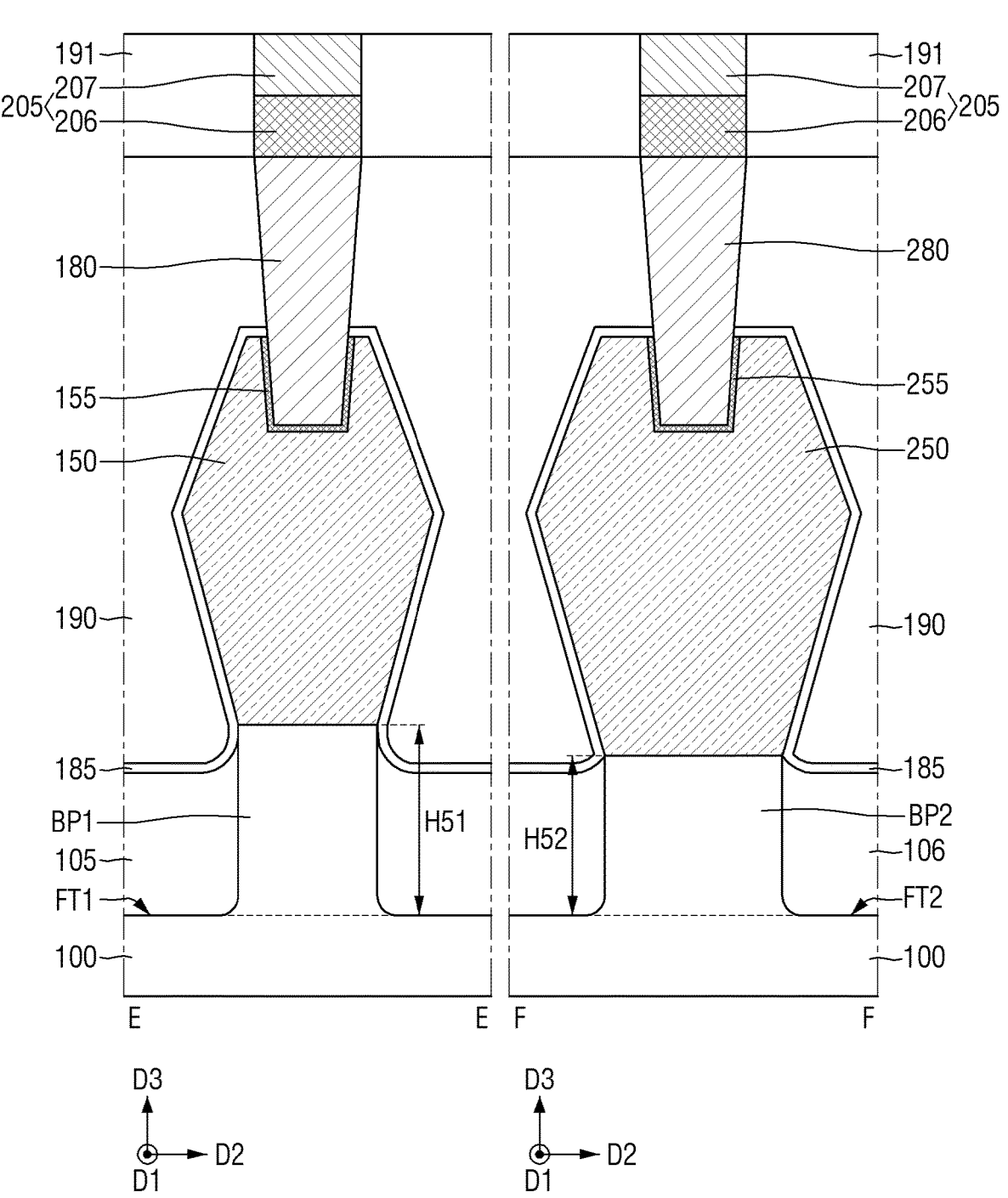
FIG. 5 is a cross-sectional view taken along E-E and F-F of FIG. 1.

FIG. 1 is an illustrative layout diagram for illustrating a semiconductor device according to some embodiments. FIG. 2 is a cross-sectional view taken along A-A of FIG. 1. FIG. 3 is a cross-sectional view taken along B-B of FIG. 1. FIG. 4 is a cross-sectional view taken along C-C and D-D of FIG. 1. FIG. 5 is a cross-sectional view taken along E-E and F-F of FIG. 1.

Referring to FIGS. 1 to 5, the semiconductor device according to some embodiments may include a first active pattern AP1, a plurality of first gate electrodes 120, a first source/drain pattern 150, a second active pattern AP2, a plurality of second gate electrodes 220, and a second source/drain pattern 250.

The substrate 100 may include a first area I and a second area II. In an implementation, the first area I and the second area II may be adjacent to each other. In an implementation, one of the second gate electrodes 220 on the second area II may be the first gate electrode 120 on the first area I. In an implementation, the first area I and the second area II may be spaced from each other.

Each of the first area I and the second area II may be a logic area, an SRAM area, or an I/O area. In an implementation, the first area I and the second area II may have the same function. In an implementation, the first area I and the second area II may have different functions.

In an implementation, the first area I and the second area II may be areas in which transistors of the same conductivity type are formed, respectively. In an implementation, the first area I and the second area II may be areas in which transistors of different conductivity types are formed, respectively.

The substrate 100 may be made of bulk silicon or SOI (silicon-on-insulator). In an implementation, the substrate 100 may be embodied as a silicon substrate, or may be made of a material other than silicon, e.g., silicon germanium, SGOI (silicon germanium on insulator), indium antimonide, lead telluride, indium arsenide, indium phosphide, gallium arsenide, or gallium antimonide. As used herein, the term "or" is not an exclusive term, e.g., "A or B" would include A, B, or A and B.

The first active pattern AP1, the plurality of first gate electrodes 120, and the first source/drain pattern 150 may be on the first area I of the substrate 100. The second active pattern AP2, the plurality of second gate electrode 220, and the second source/drain pattern 250 may be on the second area II of the substrate 100.

Each of the first active pattern AP1 and the second active pattern AP2 may be on the substrate 100. Each of the first active pattern AP1 and the second active pattern AP2 may extend (e.g., lengthwise) in a first (e.g., horizontal) direction D1.

In an implementation, one of the first active pattern AP1 and the second active pattern AP2 may extend in the first direction D1, and the other thereof may extend in a second (e.g., horizontal) direction D2 (e.g., crossing the first direction D1). In following descriptions, an example in which each of the first active pattern AP1 and the second active pattern AP2 extends in the first direction D1 is described.

Each of the first active pattern AP1 and the second active pattern AP2 may be a multi-channel active pattern. The first active pattern AP1 may include a first lower pattern BP1 and a plurality of first sheet patterns NS1. The second active pattern AP2 may include a second lower pattern BP2 and a plurality of second sheet patterns NS2.

A width W1 in the second direction D2 of the first active pattern AP1 may be different from a width W2 in the second direction D2 of the second active pattern AP2. In an implementation, the width W1 in the second direction D2 of the first active pattern AP1 may be smaller than the width W2 in the second direction D2 of the second active pattern AP2. In an implementation, the width W1 in the second direction D2 of the first active pattern AP1 may be a width in the second direction D2 of an upper surface BP1_US of the first lower pattern.

The first lower pattern BP1 may protrude from the substrate 100. The first lower pattern BP1 may extend in the first direction D1. The first lower pattern BP1 may be defined by a first fin trench FT1. The first fin trench FT1 may extend in the first direction D1.

The second lower pattern BP2 may protrude from substrate 100. The second lower pattern BP2 may extend in the first direction D1. The second lower pattern BP2 may be defined by a second fin trench FT2. The second fin trench FT2 may extend in the first direction D1.

A height H21 of the first lower pattern BP1 may be different from a height H22 of the second lower pattern BP2 (e.g., in a vertical, third direction D3). In an implementation, the height H21 of the first lower pattern BP1 may be greater than the height H22 of the second lower pattern BP2. The height H21 from a bottom surface of the first fin trench FT1 to the upper surface BP1_US of the first lower pattern may be greater than the height H22 from a bottom surface of the second fin trench FT2 to an upper surface BP2_US of the second lower pattern.

The width W1 in the second direction D2 of the upper surface BP1_US of the first lower pattern may be different from the width W2 in the second direction D2 of the upper surface BP2_US of the second lower pattern. In an implementation, the width W2 in the second direction D2 of the upper surface BP2_US of the second lower pattern may be greater than the width W1 in the second direction D2 of the upper surface BP1_US of the first lower pattern.

The plurality of first sheet patterns NS1 may be on the upper surface BP1_US of the first lower pattern. The plurality of first sheet patterns NS1 may be spaced apart from the first lower pattern BP1 in the third direction D3. The first sheet patterns NS1 may be spaced apart from each other in the third direction D3.

The first sheet patterns NS1 may include a first bottommost sheet pattern NS1_L and a first uppermost sheet pattern NS1_U. The first sheet patterns NS1 may include at least one first middle sheet pattern NS1_M between the first bottommost sheet pattern NS_L and the first uppermost sheet pattern NS1_U.

Each of the first sheet patterns NS1 may include an upper surface NS1_US and a bottom surface NS1_BS. The upper surface NS1_US of the first sheet pattern is opposite to the bottom surface NS1_BS of the first sheet pattern in the third direction D3. The bottom surface NS1_BS of the first sheet pattern faces the upper surface BP1_US of the first lower pattern.

The third direction D3 may be a direction intersecting a plane defined by the first direction D1 and the second direction D2. In an implementation, the third direction D3 may be a thickness direction of the substrate 100. The first direction D1 may be a direction intersecting the second direction D2.

The plurality of second sheet patterns NS2 may be on the upper surface BP2_US of the second lower pattern. The plurality of second sheet patterns NS2 may be spaced apart from the second lower pattern BP2 in the third direction D3. The second sheet patterns NS2 may be spaced apart from each other in the third direction D3.

The second sheet pattern NS2 may include a second bottommost sheet pattern NS2_L and a second uppermost sheet pattern NS2_U. The second sheet pattern NS2 may include at least one second middle sheet pattern NS2_M between the second bottommost sheet pattern NS2_L and the second uppermost sheet pattern NS2_U.

Each of the second sheet patterns NS2 may include an upper surface NS2_US and a bottom surface NS2_BS. The upper surface NS2_US of the second sheet pattern is opposite to the bottom surface NS2_BS of the second sheet pattern in the third direction D3. The bottom surface NS2_BS of the second sheet pattern faces the upper surface BP2_US of the second lower pattern.

The number of the first sheet patterns NS1 may be different from the number of the second sheet patterns NS2. In an implementation, the number of the first sheet patterns NS1 may be smaller than the number of the second sheet patterns NS2.

In an implementation, the number of the first middle sheet patterns NS1_M may be smaller than the number of the second middle sheet patterns NS2_M. In an implementation, the first sheet pattern NS1 may not include the middle sheet pattern, and the second sheet pattern NS2 may include the second middle sheet pattern NS2_M.

In an implementation, for convenience of illustration, the first sheet pattern NS1 may include one first middle sheet pattern NS1_M, and the second sheet pattern NS2 may include two second middle sheet patterns NS2_M.

The height H11 from the bottom surface of the first fin trench FT1 to the upper surface NS1_US of the first uppermost sheet pattern may be equal to the height H12 from the bottom surface of the second fin trench FT2 to the upper surface NS2_US of the second uppermost sheet pattern. In an implementation, when each of the bottom surface of the first fin trench FT1 and the bottom surface of the second fin trench FT2 is the upper surface of the substrate 100, the first uppermost sheet pattern NS1_U and the second uppermost sheet pattern NS2_U may be at the same height level from the upper surface of the substrate 100.

In this regard, the meaning of "same height" may mean not only that the two points are located at exactly the same height, but also that a slight difference between heights of the two points may occur due to a process margin.

A height from the bottom surface of the first fin trench FT1 to the bottom surface NS1_BS of the first bottommost sheet pattern may be greater than a height from the bottom surface of the second fin trench FT2 to the bottom surface NS2_BS of the second bottommost sheet pattern. The first bottommost sheet pattern NS1_L and the second bottommost sheet pattern NS2_L may be at different height levels from the upper surface of the substrate 100.

Each of the first lower pattern BP1 and the second lower pattern BP2 may be formed by etching a portion of the substrate 100, or may include an epitaxial layer grown from the substrate 100. Each of the first lower pattern BP1 and the second lower pattern BP2 may include silicon or germanium as an elemental semiconductor material. In an implementation, each of the first lower pattern BP1 and the second lower pattern BP2 may include a compound semiconductor, e.g., a group IV-IV compound semiconductor or a group III-V compound semiconductor.

The group IV-IV compound semiconductor may include, e.g., a binary compound including two of carbon (C), silicon (Si), germanium (Ge), and tin (Sn), a ternary compound including three thereof, or a compound obtained by doping a group IV element thereto.

The group III-V compound semiconductor may include, e.g., a binary compound obtained by combining aluminum (Al), gallium (Ga), or indium (In) as a group III element and phosphorus (P), arsenic (As), or antimony (Sb) as a group V element with each other, a ternary compound obtained by combining two of aluminum (Al), gallium (Ga), and indium (In) as a group III element and phosphorus (P), arsenic (As), or antimony (Sb) as a group V with each other, or a quaternary compound obtained by combining three of aluminum (Al), gallium (Ga), and indium (In) as a group III element and phosphorus (P), arsenic (As), or antimony (Sb) as a group V with each other.

Each of the first sheet pattern NS1 and the second sheet pattern NS2 may include silicon or germanium as an elemental semiconductor material, a group IV-IV compound semiconductor, or a group III-V compound semiconductor. Each of the first sheet patterns NS1 may include the same material as that of the first lower pattern BP1, or may include a material different from that of the first lower pattern BP1. Each of the second sheet patterns NS2 may include the same material as that of the second lower pattern BP2, or may include a material different from that of the second lower pattern BP2.

In a semiconductor device according to some embodiments, each of the first lower pattern BP1 and the second lower pattern BP2 may be a silicon lower pattern including silicon, and each of the first sheet pattern NS1 and the second sheet pattern NS2 may be a silicon sheet pattern including silicon.

A width in the second direction D2 of the first sheet pattern NS1 may be increased or decreased in proportion to a width in the second direction D2 of the upper surface BP1_US of the first lower pattern. A width in the second direction D2 of the second sheet pattern NS2 may be increased or decreased in proportion to a width in the second direction D2 of the upper surface BP2_US of the second lower pattern.

In an implementation, as illustrated, the widths in the second direction D2 of the first sheet patterns NS1 may increase or decrease in proportion to the widths in the second direction of upper surface of the first bottom pattern. In an implementation, as illustrated, the widths in the second direction D2 of the second sheet patterns NS2 may increase or decrease in proportion to the widths in the second direction of lower surface of the second lower pattern.

In an implementation, as illustrated, the widths in the second direction D2 of the first sheet patterns NS1 stacked in the third direction D3 may be equal to each other, and the widths in the second direction D2 of the second sheet patterns NS2 stacked in the third direction D3 may be equal to each other. In an implementation, the widths in the second direction D2 of the first sheet patterns NS1 stacked in the third direction D3 may decrease as it moves away from the first lower pattern BP1. This may also be applied to the second active patterns AP2 stacked in the third direction D3.

When the width W1 in the second direction D2 of the first active pattern AP1 is smaller than the width W2 in the second direction D2 of the second active pattern AP2, the number of the first sheet patterns NS1 included in the first active pattern AP1 may be smaller than the number of the second sheet patterns NS2 included in the second active pattern AP2.

In an implementation, a sheet pattern having a large width in the second direction D2 may be used for a transistor through which a larger amount of current flows. A larger number of sheet patterns are used for a transistor through which a larger amount of current flows rather than a transistor through which a smaller amount of current flows, such that performance of a semiconductor device may be improved.

A first field insulating film 105 may be on the substrate 100. The first field insulating film 105 may be on a sidewall of the first lower pattern BP1. The first field insulating film 105 may fill the first fin trench FT1. The first field insulating film 105 may not be on the upper surface BP1_US of the first lower pattern.

A second field insulating film 106 may be on the substrate 100. The second field insulating film 106 may be disposed on a of the second lower pattern BP2. The second field insulating film 106 may fill the second fin trench FT2. The second field insulating film 106 may not be on the upper surface BP2_US of the second lower pattern.

Each of the field insulating films 105 and 106 may include, e.g., an oxide film, a nitride film, an oxynitride film, or a combination film thereof. In an implementation, as illustrated, each of the field insulating films 105 and 106 may be embodied as a single film, or may be multilayer films.

A height H41 from the bottom surface of the first fin trench FT1 to an upper surface 105US of the first field insulating film may be equal to a height H42 from the bottom surface of the second fin trench FT2 to an upper surface 106US of the second field insulating film.

Taking the first field insulating film 105 by way of example, the height H41 from the bottom surface of the first fin trench FT1 to the upper surface 105US of the first field insulating film may be measured in an overlapping portion thereof with the first gate electrode 120 in the third direction D3. The height H41 from the bottom surface of the first fin trench FT1 to the upper surface 105US of the first field insulating film may be measured at a position at which the upper surface 105US of the first field insulating film 105 is closest to the first lower pattern BP1.

In an implementation, the first field insulating film 105 may cover a portion of a sidewall of the first lower pattern BP1. The second field insulating film 106 may cover an entirety of a sidewall of the second lower pattern BP2.

In an implementation, the second field insulating film 106 may cover a portion of the sidewall of the second lower pattern BP2. A height by which the first lower pattern BP1 protrudes in the third direction D3 beyond the upper surface 105US of the first field insulating film may be larger than a height by which the second lower pattern BP2 protrudes beyond the upper surface 106US of the second field insulating film in the third direction D3.

The plurality of first gate structures GS1 may be on the substrate 100. Each of the first gate structures GS1 may extend in the second direction D2. The first gate structures GS1 may be spaced apart from each other in the first direction D1. The first gate structures GS1 may be adjacent to each other in the first direction D1. In an implementation, the first gate structure GS1 may be disposed in the first direction D1 on each of both opposing sides of the first source/drain pattern 150.

The first gate structure GS1 may be on the first active pattern AP1. The first gate structure GS1 may intersect the first active pattern AP1. The first gate structure GS1 may intersect the first lower pattern BP1. The first gate structure GS1 may surround each of the first sheet patterns NS1.

The first gate structure GS1 may include, e.g., a first gate electrode 120, a first gate insulating film 130, a first gate spacer 140, and a first gate capping pattern 145.

The first gate structures GS1 may include a plurality of first inner gate structures INT1_GS1, INT2_GS1, and INT3_GS1 respectively between the first sheet patterns NS1 adjacent to each other in the third direction D3 and between the first lower pattern BP1 and the first bottommost sheet pattern NS1. The first inner gate structures INT1_GS1, INT2_GS1, and INT3_GS1 may be respectively between the upper surface BP1_US of the first lower pattern and the bottom surface NS1_BS of the first bottommost sheet pattern, and between the upper surface NS1_US of the first sheet pattern and the bottom surface NS1_BS of the first sheet pattern facing each other in the third direction D3.

The number of the first inner gate structures INT1_GS1, INT2_GS1, and INT3_GS1 may be equal to the number of the first sheet patterns NS1. In an implementation, the first gate structures GS1 may include three first inner gate structures INT1_GS1, INT2_GS1, and INT3_GS1.

The first inner gate structures INT1_GS1, INT2_GS1, and INT3_GS1 may be in (e.g., direct) contact with the upper surface BP1_US of the first lower pattern, the upper surface NS1_US of the first sheet pattern and the bottom surface NS1_BS of the first sheet pattern. In the semiconductor device according to some embodiments, the first inner gate structures INT1_GS1, INT2_GS1, and INT3_GS1 may contact the first source/drain pattern 150 to be described later.

The first inner gate structures INT1_GS1, INT2_GS1, and INT3_GS1 may include the first gate electrode 120 and the first gate insulating film 130 between adjacent first sheet patterns NS1, and the first gate electrode 120 and the first gate insulating film 130 between the first lower pattern BP1 and the first sheet pattern NS1.

A plurality of second gate structures GS2 may be on the substrate 100. Each of the second gate structures GS2 may extend in the second direction D2. The second gate structures GS2 may be spaced apart from each other in the first direction D1. The second gate structures GS2 may be adjacent to each other in the first direction D1. In an implementation, the second gate structure GS2 may be on each of both opposing sides in the first direction D1 of the second source/drain pattern 250.

The second gate structures GS2 may be on the second active pattern AP2. The second gate structure GS2 may intersect the second active pattern AP2. The second gate structure GS2 may intersect the second lower pattern BP2. The second gate structure GS2 may surround each of the second sheet patterns NS2.

The second gate structure GS2 may include, e.g., a second gate electrode 220, a second gate insulating film 230, a second gate spacer 240, and a second gate capping pattern 245.

The second gate structures GS2 may include a plurality of second inner gate structures INT1_GS2, INT2_GS2, INT3_GS2, and INT4_GS2 respectively between the second sheet patterns NS2 adjacent to each other in the third direction D3 and between the second lower pattern BP2 and the second sheet pattern NS2. The second inner gate structures INT1_GS2, INT2_GS2, INT3_GS2, and INT4_GS2 may be respectively between the upper surface BP2_US of the second lower pattern and the bottom surface NS2_BS of the second bottommost sheet pattern, and between the upper surface NS2_US of the second sheet pattern and the bottom surface NS2_BS of the second sheet pattern facing each other in the third direction D3. In an implementation, the second gate structures GS2 may include four second inner gate structures INT1_GS2, INT2_GS2, INT3_GS2, and INT4_GS2.

The second inner gate structures INT1_GS2, INT2_GS2, INT3_GS2, and INT4_GS2 may be in contact with the upper surface BP2_US of the second lower pattern, the upper surface NS2_US of the second sheet pattern and the bottom surface NS2_BS of the second sheet pattern. In the semiconductor device according to some embodiments, the second inner gate structures INT1_GS2, INT2_GS2, INT3_GS2, and INT4_GS2 may contact the second source/drain pattern 250 to be described below.

The second inner gate structures INT1_GS2, INT2_GS2, INT3_GS2, and INT4_GS2 may include the second gate electrode 220 and the second gate insulating film 230 between the adjacent second sheet patterns NS2 and the second gate electrode 220 and the second gate insulating film 230 between the second lower pattern BP2 and the second sheet pattern NS2.

When the first active pattern AP1 and the second active pattern AP2 extend in different directions, a direction in which the second gate structure GS2 extends is different from a direction in which the first gate structure GS1 extends.

The first gate electrode 120 may be on the first lower pattern BP1. The first gate electrode 120 may intersect the first lower pattern BP1. The first gate electrode 120 may surround the first sheet pattern NS1.

The second gate electrode 220 may be on the second lower pattern BP2. The second gate electrode 220 may intersect the second lower pattern BP2. The second gate electrode 220 may surround the second sheet pattern NS2.

A height H31 from the upper surface NS1_US of the first uppermost sheet pattern to an upper surface 120_US of the first gate electrode may be equal to a height H32 from the upper surface NS2_US of the second uppermost sheet pattern to an upper surface 220_US of the second gate electrode.

A height H11+H31 from the bottom surface of the first fin trench FT1 to the upper surface 120_US of the first gate electrode may be equal to a height H12+H32 from the bottom surface of the second fin trench FT2 to the upper surface 220_US of the second gate electrode.

A height H11+H31−H21 from the upper surface BP1_US of the first lower pattern to the upper surface 120_US of the first gate electrode may be smaller than a height H12+H32−H22 from the upper surface BP2_US of the second lower pattern to the upper surface 220_US of the second gate electrode.

In an implementation, as shown in FIGS. 2 and 3, each of the upper surface 120_US of the first gate electrode and the upper surface 220_US of the second gate electrode may be a concavely curved surface. In an implementation, each of the upper surface 120_US of the first gate electrode and the upper surface 220_US of the second gate electrode may be planar.

Each of the first gate electrode 120 and the second gate electrode 220 may include a metal, a metal alloy, a conductive metal nitride, a metal silicide, a doped semiconductor material, a conductive metal oxide, or a conductive metal oxynitride. Each of the first gate electrode 120 and the second gate electrode 220 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) or combinations thereof. The gate electrode 120 may include a conductive metal oxide, a conductive metal oxynitride, or the like or may include oxidized products of the above-mentioned materials.

The first gate electrode 120 may be on each of both opposing sides of the first source/drain pattern 150 to be described below. The first gate structure GS1 may be on each of both opposing sides in the first direction D1 of the first source/drain pattern 150.

In an implementation, each of the first gate electrodes 120 respectively on both opposing sides of the first source/drain pattern 150 may be a normal gate electrode used as a gate of a transistor. In an implementation, the first gate electrode 120 on one side of the first source/drain pattern 150 may be used as a gate of a transistor, and the first gate electrode 120 on the other side of the first source/drain pattern 150 may be a dummy gate electrode.

The second gate electrode 220 may be on each of both opposing sides of the second source/drain pattern 250 to be described below. The second gate structure GS2 may be on each of both opposing sides in the first direction D1 of the second source/drain pattern 250.

In an implementation, each of the second gate electrodes 220 respectively on both opposing sides of the second source/drain pattern 250 may be a normal gate electrode used as a gate of a transistor. In an implementation, the second gate electrode 220 on one side of the second source/drain pattern 250 may be used as a gate of the transistor, and the second gate electrode 220 on the other side of the second source/drain pattern 250 may be a dummy gate electrode.

The first gate insulating film 130 may extend along the upper surface 105US of the first field insulating film, and upper surface BP1_US of the first lower pattern. The first gate insulating film 130 may surround the plurality of first sheet patterns NS1. The first gate insulating film 130 may be along a circumference of the first sheet pattern NS1. The first gate electrode 120 may be on the first gate insulating film 130. The first gate insulating film 130 may be between the first gate electrode 120 and the first sheet pattern NS1.

The second gate insulating film 230 may extend along the upper surface 106US of the second field insulating film, and the upper surface BP2_US of the second lower pattern. The second gate insulating film 230 may surround the plurality of second sheet patterns NS2. The second gate insulating film 230 may be along a circumference of the second sheet pattern NS2. The second gate electrode 220 may be on the second gate insulating film 230. The second gate insulating film 230 may be between the second gate electrode 220 and the second sheet pattern NS2.

Each of the first gate insulating film 130 and the second gate insulating film 230 may include silicon oxide, silicon oxynitride, silicon nitride, or a high dielectric constant material having a higher dielectric constant than that of silicon oxide. The high dielectric constant material may include, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

In an implementation, each of the first gate insulating film 130 and the second gate insulating film 230 may be a single film. In an implementation, each of the first gate insulating film 130 and the second gate insulating film 230 may include a plurality of films. The first gate insulating film 130 may include an interfacial layer between the first active pattern AP1 and the first gate electrode 120, and a high dielectric constant insulating film. The second gate insulating film 230 may include an interfacial layer between the second active pattern AP2 and the second gate electrode 220, and a high dielectric constant insulating film. In an implementation, the interfacial layer may not be along a profile of each of the upper surface 105US of the first field insulating film and the upper surface 106US of the second field insulating film.

The semiconductor device according to some embodiments may include an NC (negative capacitance) FET using a negative capacitor. In an implementation, the first gate insulating film 130 or the second gate insulating film 230 may include a ferroelectric material film having ferroelectric properties. In an implementation, the first gate insulating film 130 or the second gate insulating film 230 may include a ferroelectric material film having ferroelectric properties and a paraelectric material film having paraelectric properties.

The ferroelectric material film may have negative capacitance, and the paraelectric material film may have positive capacitance. In an implementation, when two or more capacitors are connected in series to each other, and capacitance of each of the capacitors has a positive value, a total capacitance may be smaller than capacitance of each individual capacitor. In an implementation, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, e.g., hafnium oxide, hafnium zirconium oxide, barium strontium titanium oxide, barium titanium oxide, or lead zirconium titanium oxide. In an implementation, hafnium zirconium oxide may refer to a material obtain by doping hafnium oxide with zirconium (Zr). In an implementation, hafnium zirconium oxide may refer to a compound of hafnium (Hf), zirconium (Zr), and oxygen (O).

The ferroelectric material film may further contain doped dopants. In an implementation, the dopant may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, e.g., gadolinium (Gd), silicon (Si), zirconium (Zr), aluminum (Al), or yttrium (Y).

When the dopant is aluminum (Al), the ferroelectric material film may include about 3 to about 8 at % (atomic %) of aluminum. In an implementation, a content of the dopant may be a content of aluminum based on a sum of hafnium and aluminum.

When the dopant is silicon (Si), the ferroelectric material film may include about 2 to about 10 at % of silicon. When the dopant is yttrium (Y), the ferroelectric material film may include about 2 to about 10 at % yttrium. When the dopant is gadolinium (Gd), the ferroelectric material film may include about 1 to about 7 at % gadolinium. When the dopant is zirconium (Zr), the ferroelectric material film may include about 50 to about 80 at % zirconium.

The paraelectric material film may have paraelectric properties. The paraelectric material film may include, e.g., silicon oxide or a metal oxide having a high dielectric constant. In an implementation, the metal oxide contained in the paraelectric material film may include, e.g., hafnium oxide, zirconium oxide, or aluminum oxide.

The ferroelectric material film and the paraelectric material film may include the same material. The ferroelectric material film may have ferroelectric properties, and the paraelectric material film may not have the ferroelectric properties. In an implementation, when each of the ferroelectric material film and the paraelectric material film includes hafnium oxide, a crystal structure of hafnium oxide contained in the ferroelectric material film may be different from a crystal structure of hafnium oxide contained in the paraelectric material film.

The ferroelectric material film may have a thickness sized to exhibit ferroelectric properties. In an implementation, the thickness of the ferroelectric material film may be, e.g., in a range of about 0.5 to about 10 nm. In an implementation, a critical thickness exhibiting the ferroelectric properties may be vary based on a type of the ferroelectric material, and the thickness of the ferroelectric material film may vary depending on the type of the ferroelectric material.

In an implementation, the first gate insulating film 130 or the second gate insulating film 230 may include one ferroelectric material film. In an implementation, the first gate insulating film 130 or the second gate insulating film 230 may include a plurality of ferroelectric material films spaced apart from each other. The first gate insulating film 130 and/or the second gate insulating film 230 may have a multilayer structure in which a plurality of ferroelectric material films and a plurality of paraelectric material films are alternately stacked.

The first gate spacer 140 may be on a sidewall of the first gate electrode 120. The first gate spacer 140 may not be between the first lower pattern BP1 and the first sheet pattern NS1 and between the first sheet patterns NS1 adjacent to each other in the third direction D3.

The second gate spacer 240 may be on a sidewall of the second gate electrode 220. The second gate spacer 240 may not be between the second lower pattern BP2 and the second sheet pattern NS2 and between the second sheet patterns NS1 adjacent to each other in the third direction D3.

Each of the first gate spacer 140 and the second gate spacer 240 may include, e.g., silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or combinations thereof. In an implementation, each of the first gate spacer 140 and the second gate spacer 240 may be a single film, or may be a multilayer film.

The first gate capping pattern 145 may be on the first gate electrode 120 and the first gate spacer 140. The second gate capping pattern 245 may be on the second gate electrode 220 and the second gate spacer 240. Each of an upper surface of the first gate capping pattern 145 and an upper surface of the second gate capping pattern 245 may be coplanar with an upper surface of a first interlayer insulating film 190.

In an implementation, the first gate capping pattern 145 may be between the first gate spacers 140, and the second gate capping pattern 245 may be between the second gate spacers 240.

Each of the first gate capping pattern 145 and the second gate capping pattern 245 may include, e.g., silicon nitride (SiN), silicon oxynitride (SiON), silicon carbonitride (SiCN), silicon oxycarbonitride (SiOCN) or combinations thereof. Each of the first gate capping pattern 145 and the second gate capping pattern 245 may include a material having an etching selectivity with respect to a material of the first interlayer insulating film 190.

The first source/drain pattern 150 may be on the first active pattern AP1. The first source/drain pattern 150 may be on the first lower pattern BP1. The first source/drain pattern 150 may be connected to the plurality of first sheet patterns NS1. The first source/drain pattern 150 may be in contact with the plurality of first sheet patterns NS1.

The first source/drain pattern 150 may be on a side surface of the first gate structure GS1. The first source/drain pattern 150 may be between the first gate structures GS1 adjacent to each other in the first direction D1. In an implementation, the first source/drain pattern 150 may be on each of both opposing sides of the first gate structure GS1. In an implementation, the first source/drain pattern 150 may be on one side of the first gate structure GS1 and may not be on the other side of the first gate structure GS1.

The second source/drain pattern 250 may be on the second active pattern AP2. The second source/drain pattern 250 may be on the second lower pattern BP2. The second source/drain pattern 250 may be connected to the plurality of second sheet patterns NS2. The second source/drain pattern 250 may be in contact with the plurality of second sheet patterns NS2.

The second source/drain pattern 250 may be on a side surface of the second gate structure GS2. The second source/drain pattern 250 may be between the second gate structure GS2 adjacent to each other in the first direction D1. In an implementation, the second source/drain pattern 250 may be on each of both opposing sides of the second gate structure GS2. In an implementation, the second source/drain pattern 250 may be on one side of the second gate structure GS2 and may not be on the other side of the second gate structure GS2.

Each of the first source/drain pattern 150 and the second source/drain pattern 250 may be included in a source/drain of each transistor using each of the first sheet pattern NS1 and the second sheet pattern NS2 as a channel area.

In an implementation, as illustrated in FIG. 5, bottoms of the first source/drain pattern 150 and the second source/drain pattern 250 may be at different heights from the upper surface of the substrate 100. A height H51 from the bottom surface of the first fin trench FT1 to the bottommost surface of the first source/drain pattern 150 may be different from a height H52 from the bottom surface of the second fin trench FT2 to the bottommost surface of the second source/drain pattern 250. The height H51 from the bottom surface of the first fin trench FT1 to the bottommost surface of the first source/drain pattern 150 may be greater than the height H52 from the bottom surface of the second fin trench FT2 to the bottommost surface of the second source/drain pattern 250.

In an implementation, as illustrated in FIG. 2, FIG. 3 and FIG. 5, a depth from the upper surface NS1_US of the first uppermost sheet pattern to the bottommost surface of the first source/drain pattern 150 may be smaller than a depth from the upper surface NS2_US of the second uppermost sheet pattern to the bottommost surface of the second source/drain pattern 250.

In an implementation, as illustrated in the drawings, the first source/drain pattern 150 may include a plurality of width extension areas. In an implementation, as illustrated in the drawings, the second source/drain pattern 250 may include a plurality of width extension areas. In an implementation, in the first source/drain pattern 150 (or the second source/drain pattern 250), each of the width extension areas may include a portion of which a width in the first direction D1 increases, and a second portion of which a width in the first direction D1 decreases.

Each of the first source/drain pattern 150 and the second source/drain pattern 250 may include an epitaxial pattern. Each of the first source/drain pattern 150 and the second source/drain pattern 250 may include a semiconductor material.

Each of the first source/drain pattern 150 and the second source/drain pattern 250 may include, e.g., silicon or germanium as an elemental semiconductor material. In an implementation, each of the first source/drain pattern 150 and the second source/drain pattern 250 may include, e.g., a binary compound including two of carbon (C), silicon (Si), germanium (Ge), and tin (Sn), a ternary compound including three of carbon (C), silicon (Si), germanium (Ge), and tin (Sn), or a compound obtained by doping a group IV element thereto. In an implementation, each of the first source/drain pattern 150 and the second source/drain pattern 250 may include, e.g., silicon, silicon germanium, germanium, silicon carbide, or the like.

Each of the first source/drain pattern 150 and the second source/drain pattern 250 may contain impurities doped into the semiconductor material. In an implementation, each of the first source/drain pattern 150 and the second source/drain pattern 250 may contain, e.g., n-type impurities. The doped impurities may include phosphorus (P), arsenic (As), antimony (Sb) or bismuth (Bi). In an implementation, each of the first source/drain pattern 150 and the second source/drain pattern 250 may include, e.g., p-type impurities. The doped impurities may include boron (B). In an implementation, one of the first source/drain pattern 150 and the second source/drain pattern 250 may include the n-type impurity, and the other thereof may include the p-type impurity.

In an implementation, as illustrated, each of the first source/drain pattern 150 and the second source/drain pattern 250 may be a single film, or may be a multilayer film. In an implementation, as illustrated in FIG. 5, each of the first source/drain pattern 150 and the second source/drain pattern 250 may have a shape similar to a hexagon.

A source/drain etch stop film 185 may be on a sidewall of the first gate structure GS1 and an upper surface 150US of the first source/drain pattern. The source/drain etch stop film 185 may be on a sidewall of the second gate structure GS2 and an upper surface 250US of the second source/drain pattern. The source/drain etch stop film 185 may extend along the upper surface 105US of the first field insulating film and upper surface 106US of the second field insulating film.

The source/drain etch stop film 185 may include a material having an etch selectivity with respect to a material of the first interlayer insulating film 190 to be described below. The source/drain etch stop film 185 may include, e.g., silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or combinations thereof.

The first interlayer insulating film 190 may be on the source/drain etch stop film 185. The first interlayer insulating film 190 may be on the first source/drain pattern 150 and the second source/drain pattern 250. The first interlayer insulating film 190 may not cover the upper surface of the first gate capping pattern 145 and the upper surface of the second gate capping pattern 245.

The first interlayer insulating film 190 may include, e.g., silicon oxide, silicon nitride, silicon oxynitride, or a low-k material (a low dielectric constant material). The low dielectric constant material may include, e.g., fluorinated tetraethylorthosilicate (FTEOS), hydrogen silsesquioxane (HSQ), bisbenzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof.

A first source/drain contact 180 may be on the first source/drain pattern 150. The first source/drain contact 180 may be connected to the first source/drain pattern 150. The first source/drain contact 180 may extend through the first interlayer insulating film 190 and the source/drain etch stop film 185 so as to be connected to the first source/drain pattern 150.

A second source/drain contact 280 may be on the second source/drain pattern 250. The second source/drain contact 280 may be connected to the second source/drain pattern 250.

A first contact silicide layer 155 may be between the first source/drain contact 180 and the first source/drain pattern 150. A second contact silicide layer 255 may be between the second source/drain contact 280 and the second source/drain pattern 250.

In an implementation, as illustrated, each of the first source/drain contact 180 and the second source/drain contact 280 may be a single layer, or may be a multilayer. Each of the first source/drain contact 180 and the second source/drain contact 280 may include, e.g., a metal, a metal alloy, a conductive metal nitride, a conductive metal carbide, a conductive metal oxide, a conductive metal carbonitride, or a two-dimensional (2D) material.

Each of the first contact silicide layer 155 and the second contact silicide layer 255 may include metal silicide.

A second interlayer insulating film 191 may be on the first interlayer insulating film 190, the first gate structure GS1, the second gate structure GS2, the first source/drain contact 180, and the second source/drain contact 280.

The second interlayer insulating film 191 may include, e.g., silicon oxide, silicon nitride, silicon carbonitride, silicon oxynitride, or a low-k material.

A wiring structure 205 may be in the second interlayer insulating film 191. The wiring structure 205 may include a via plug 206 and a wiring line 207. The wiring structure 205 may be connected to the first source/drain contact 180 and the second source/drain contact 280.

Each of the via plug 206 and the wiring line 207 may include, e.g., a metal, a metal alloy, a conductive metal nitride, a conductive metal carbide, a conductive metal oxide, a conductive metal carbonitride, or a 2D material.

In an implementation, as illustrated, each of the via plug 206 and the wiring line 207 may be a single layer, or may be a multilayer. In an implementation, the via plug 206 and the wiring line 207 may be integral structure.

Figure 6:
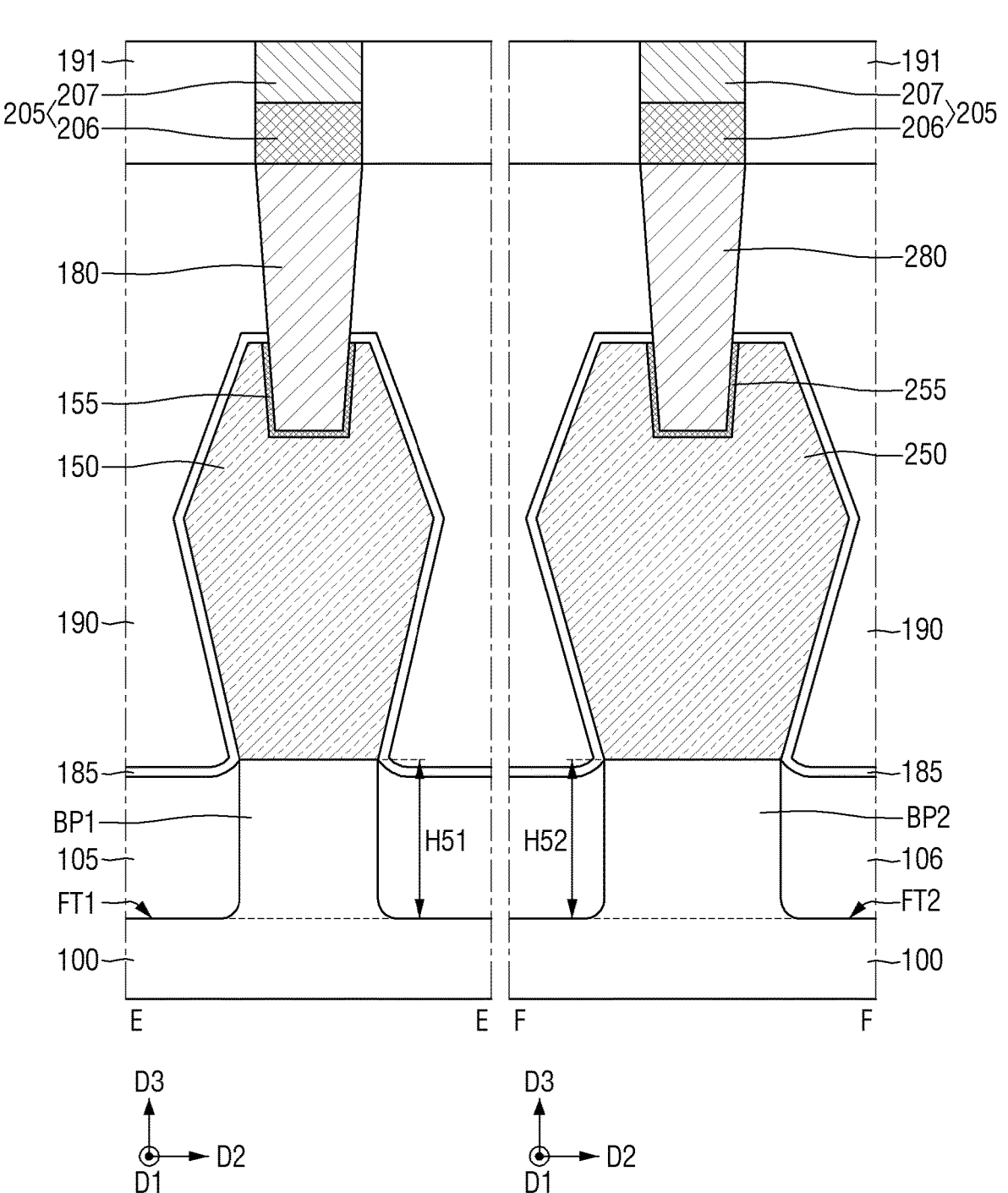
FIG. 6 is a diagram for illustrating a semiconductor device according to some embodiments.
Figure 7:
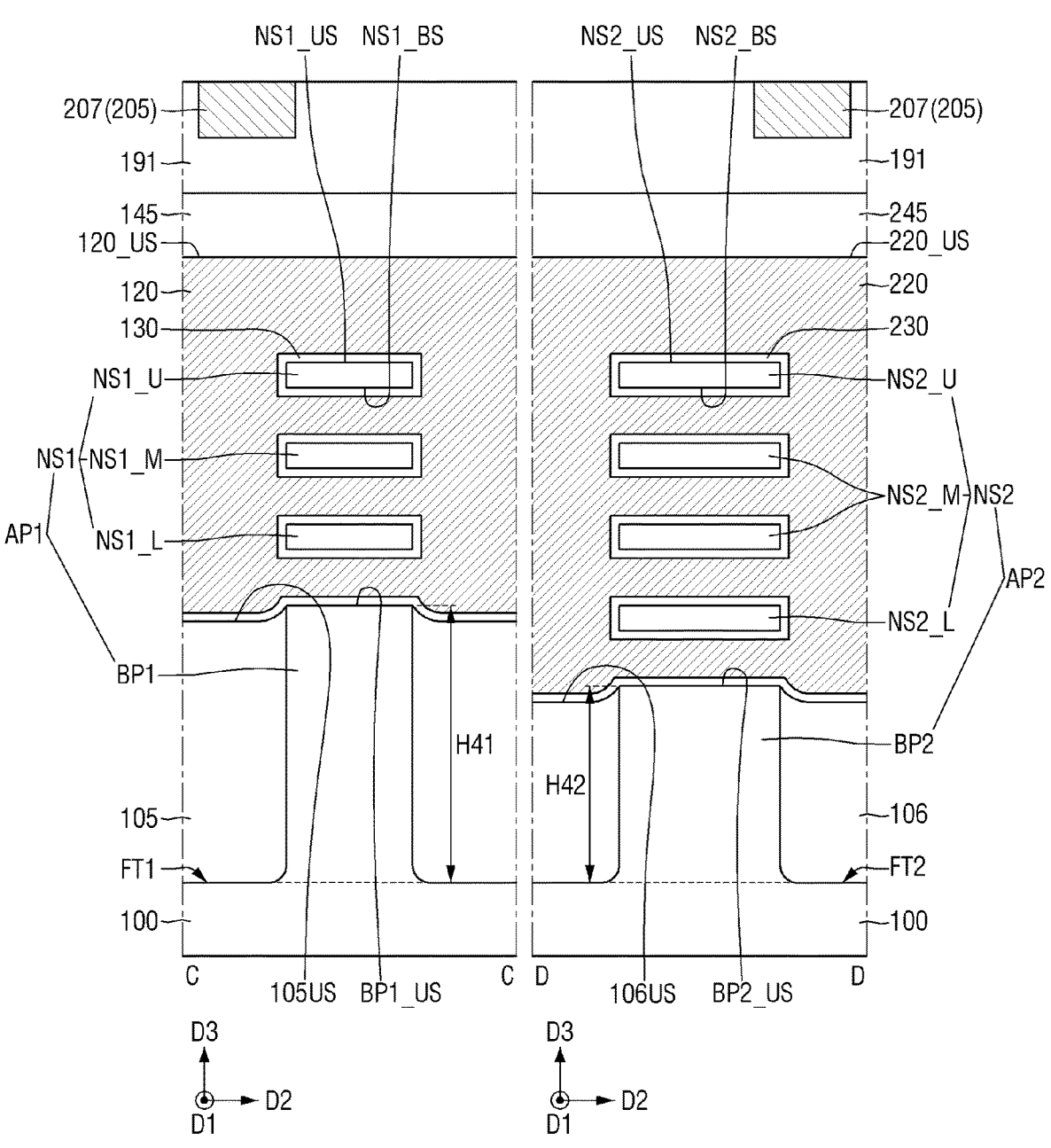
FIG. 7 is a diagram for illustrating a semiconductor device according to some embodiments.

FIG. 6 is a diagram for illustrating a semiconductor device according to some embodiments. FIG. 7 is a diagram for illustrating a semiconductor device according to some embodiments. For convenience of description, following descriptions are based on differences thereof from those as set forth above with reference to FIGS. 1 to 5.

Referring to FIG. 6, in the semiconductor device according to some embodiments, the height H51 from the bottom surface of the first fin trench FT1 to the bottommost surface of the first source/drain pattern 150 may be equal to the height H52 from the bottom surface of the second fin trench FT2 the bottommost surface of the second source/drain pattern 250.

Bottoms of the first source/drain pattern 150 and the second source/drain pattern 250 may be at the same height level from the upper surface of the substrate 100.

In FIG. 2 and FIG. 3, the depth from the upper surface NS1_US of the first uppermost sheet pattern to the bottommost surface of the first source/drain pattern 150 may be equal to the depth from the upper surface NS2_US of the second uppermost sheet pattern to the bottommost surface of the second source/drain pattern 250.

Referring to FIG. 7, in the semiconductor device according to some embodiments, the height H41 from the bottom surface of the first fin trench FT1 to the upper surface 105US of the first field insulating film may be greater than the height H42 from the bottom surface of the second fin trench FT2 to the upper surface 106US of the second field insulating film.

In an implementation, the first field insulating film 105 may cover an entirety of the sidewall of the first lower pattern BP1. The second field insulating film 106 may cover an entirety of the sidewall of the second lower pattern BP2.

In an implementation, the first field insulating film 105 may cover a portion of the sidewall of the first lower pattern BP1. In an implementation, the second field insulating film 106 may cover a portion of the sidewall of the second lower pattern BP2.

Figure 8:
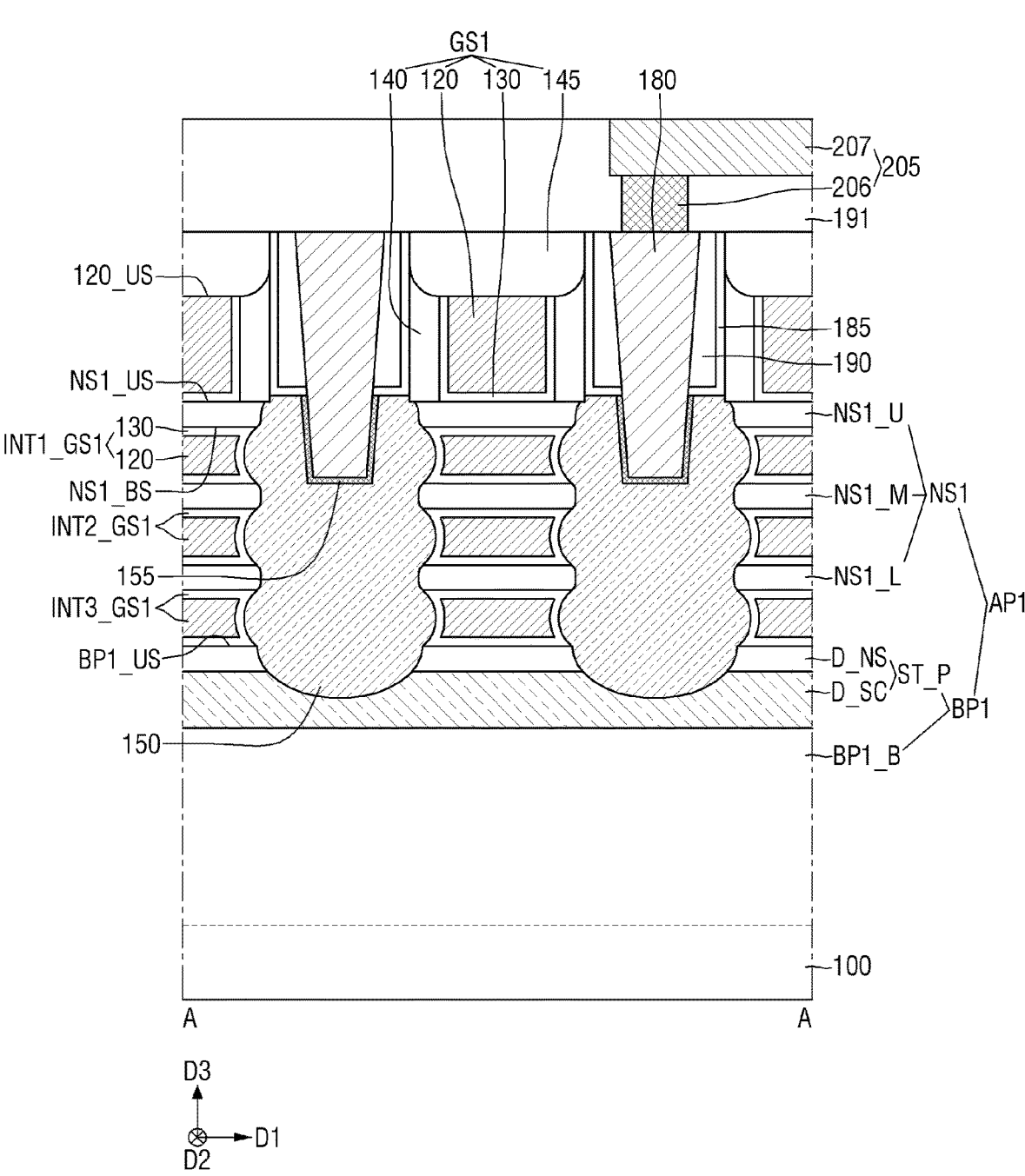
FIGS. 8 to 10 are diagrams for illustrating a semiconductor device according to some embodiments.
Figure 9:
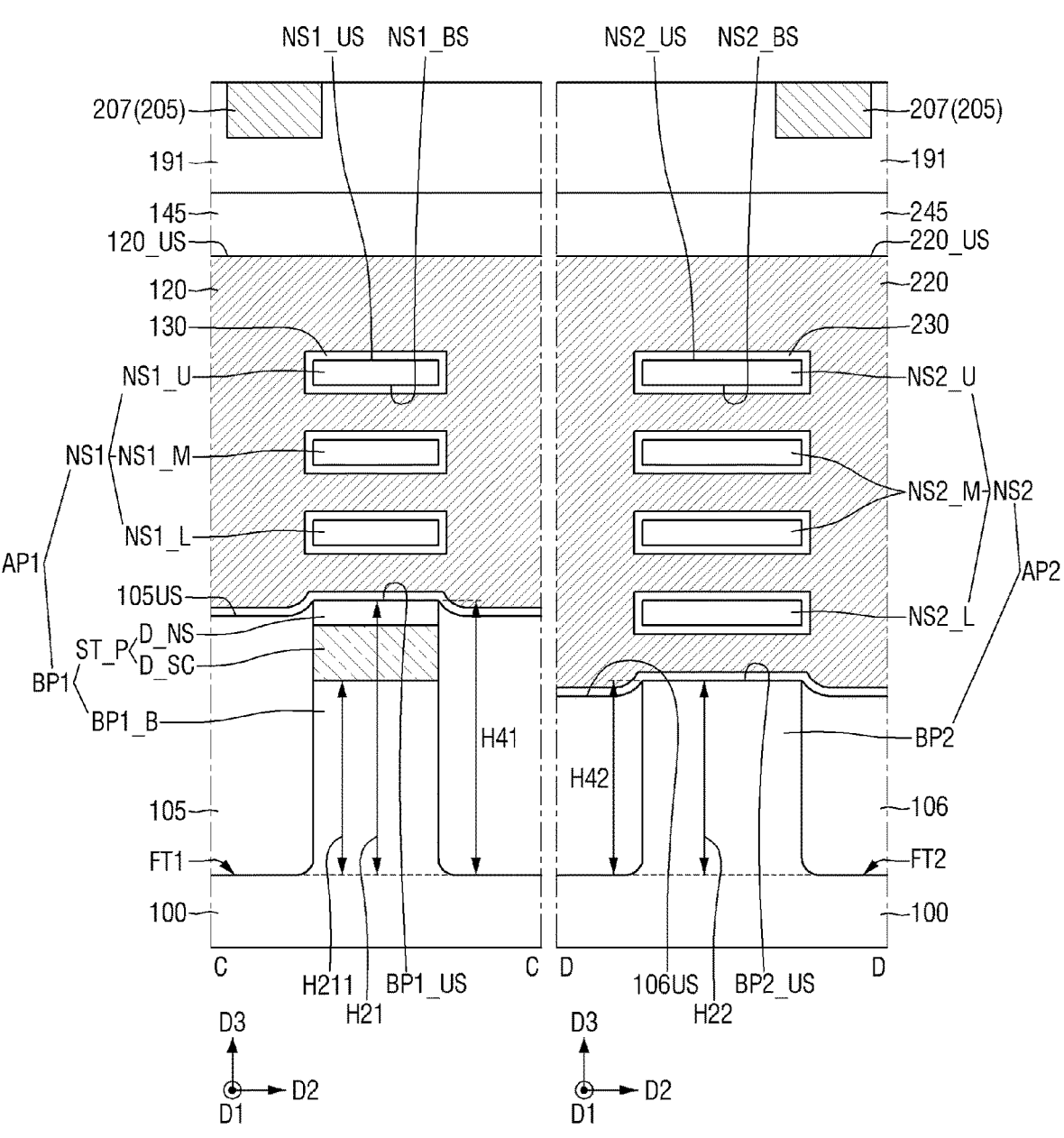
Figure 10:
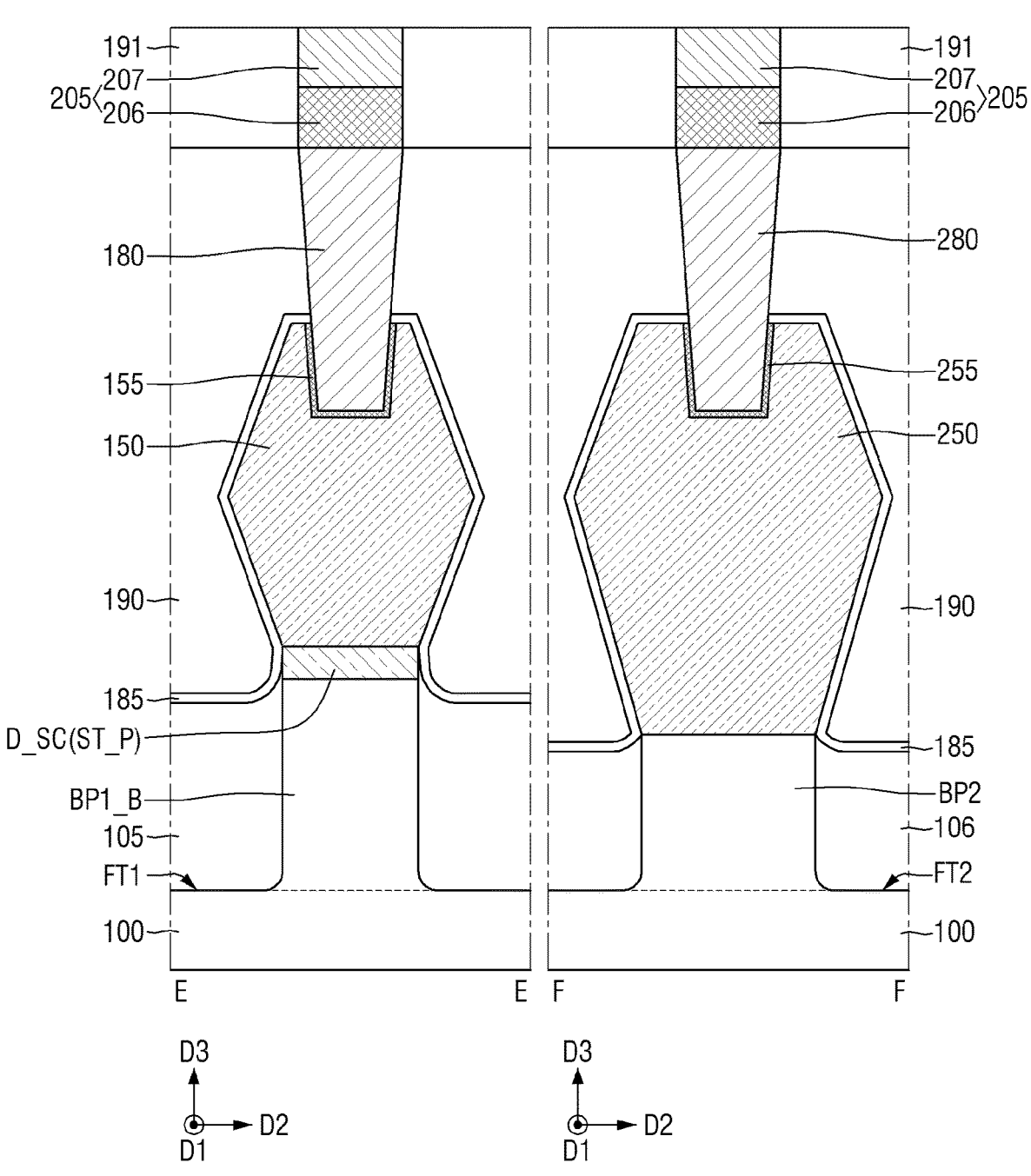

FIGS. 8 to 10 are diagrams for illustrating a semiconductor device according to some embodiments. For convenience of description, following descriptions are based on differences thereof from those as set forth above with reference to FIGS. 1 to 5.

Referring to FIGS. 8 to 10, in a semiconductor device according to some embodiments, the first lower pattern BP1 may include a base lower pattern BP1_B and a lower stack pattern ST_P.

The base lower pattern BP1_B may protrude from the substrate 100. The lower stack pattern ST_P may be on the base lower pattern BP B. The lower stack pattern ST_P may contact the base lower pattern BP1_B.

The lower stack pattern ST_P may include at least one sacrificial pattern D_SC and at least one dummy sheet pattern D_NS. The sacrificial patterns D_SC and the dummy sheet patterns D_NS may be alternately stacked on top of each other on the base lower pattern BP1_B. In an implementation, the dummy sheet pattern D_NS may include an upper surface BP1_US of the first lower pattern.

In an implementation, the number of the sacrificial patterns D_SC included in the first lower pattern BP1 may be equal to the number of the dummy sheet patterns D_NS included in the first lower pattern BP1. In an implementation, as illustrated, the first lower pattern BP1 may include one sacrificial pattern D_SC and one dummy sheet pattern D_NS.

A sum of the numbers of the dummy sheet patterns D_NS included in the first lower pattern BP1 and the number of the first sheet patterns NS1 may be equal to the number of the second sheet patterns NS2.

In an implementation, a height H211 of the base lower pattern BP1_B may be equal to a height H22 of the second lower pattern BP2. A difference between a height from the substrate to the upper surface BP1_US of the first lower pattern and a height from the substrate to the upper surface BP2_US of the second lower pattern may be a height of the lower stack pattern ST_P.

In an implementation, the second lower pattern BP2 may include a lower stack pattern ST_P as the first lower pattern BP1 may. The number of the sacrificial patterns included in the second lower pattern BP2 may be smaller than the number of the sacrificial patterns D_SC included in the first lower pattern BP1. The number of the dummy sheet patterns included in the second lower pattern BP2 may be smaller than the number of the dummy sheet patterns D_NS included in the first lower pattern BP1.

The dummy sheet pattern D_NS may include the same material as that of each of the first sheet pattern NS1 and the second sheet pattern NS2. When the first lower pattern BP1 includes one dummy sheet pattern D_NS, the dummy sheet pattern D_NS may include the same material as that of the second bottommost sheet pattern NS2_L. In an implementation, the sacrificial pattern D_SC may include, e.g., silicon germanium.

The first field insulating film 105 may cover an entirety of a sidewall of the base lower pattern BP1_B. The first field insulating film 105 may cover at least a portion of a sidewall of the lower stack pattern ST_P. The first field insulating film 105 may cover an entirety of a sidewall of the uppermost sacrificial pattern D_SC.

The height H41 from the bottom surface of the first fin trench FT1 to the upper surface 105US of the first field insulating film may be greater than the height H42 from the bottom surface of the second fin trench FT2 to the upper surface 106US of the second field insulating film.

In an implementation, as illustrated, the first source/drain pattern 150 may be on the sacrificial pattern D_SC. In an implementation, based on the upper surface of the substrate 100, a height of the bottommost surface of the first source/drain pattern 150 may be lower than that of an upper surface of the base lower pattern BP1_B.

Figure 11:
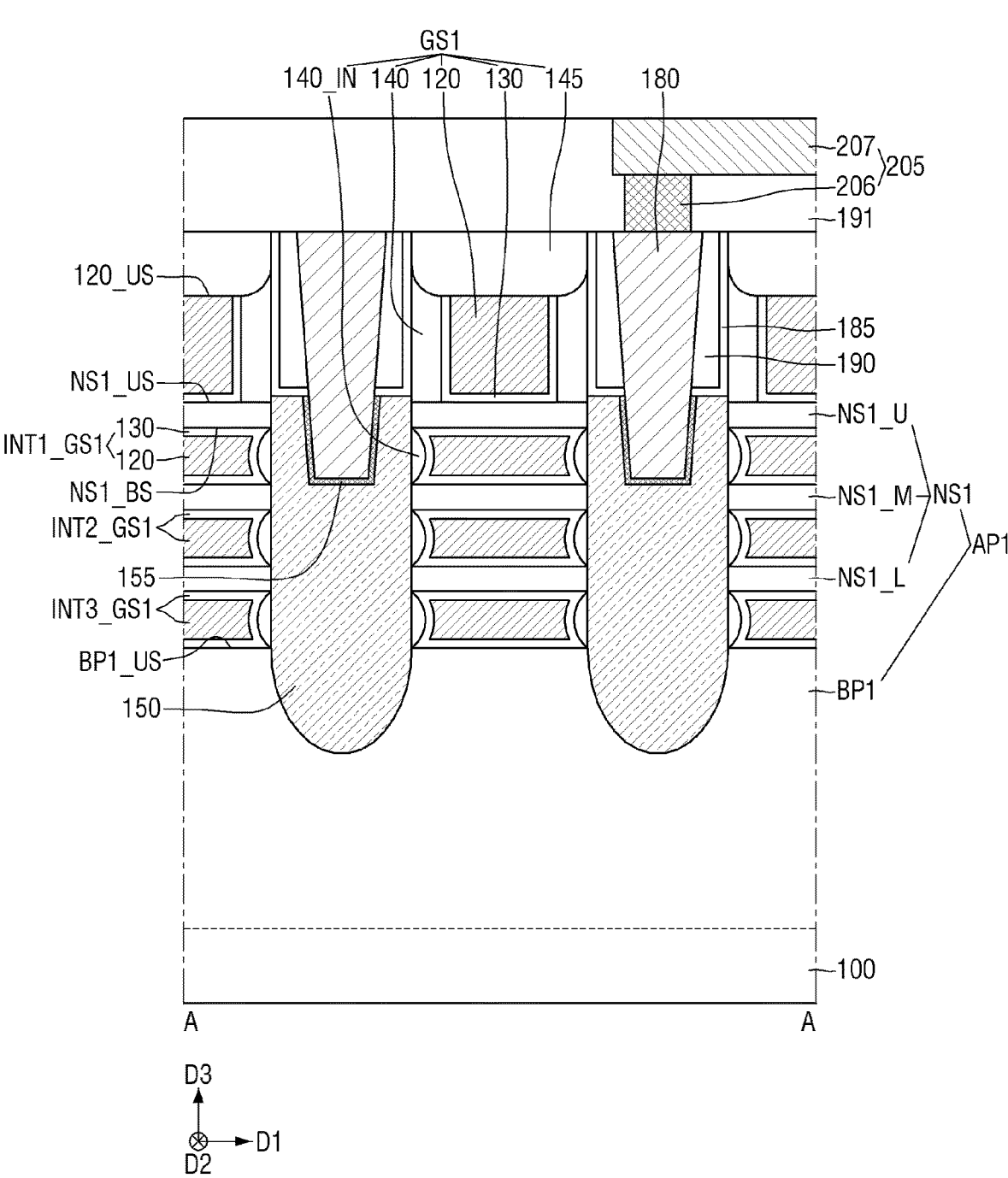
FIGS. 11 and 12 are diagrams for illustrating a semiconductor device according to some embodiments.
Figure 12:
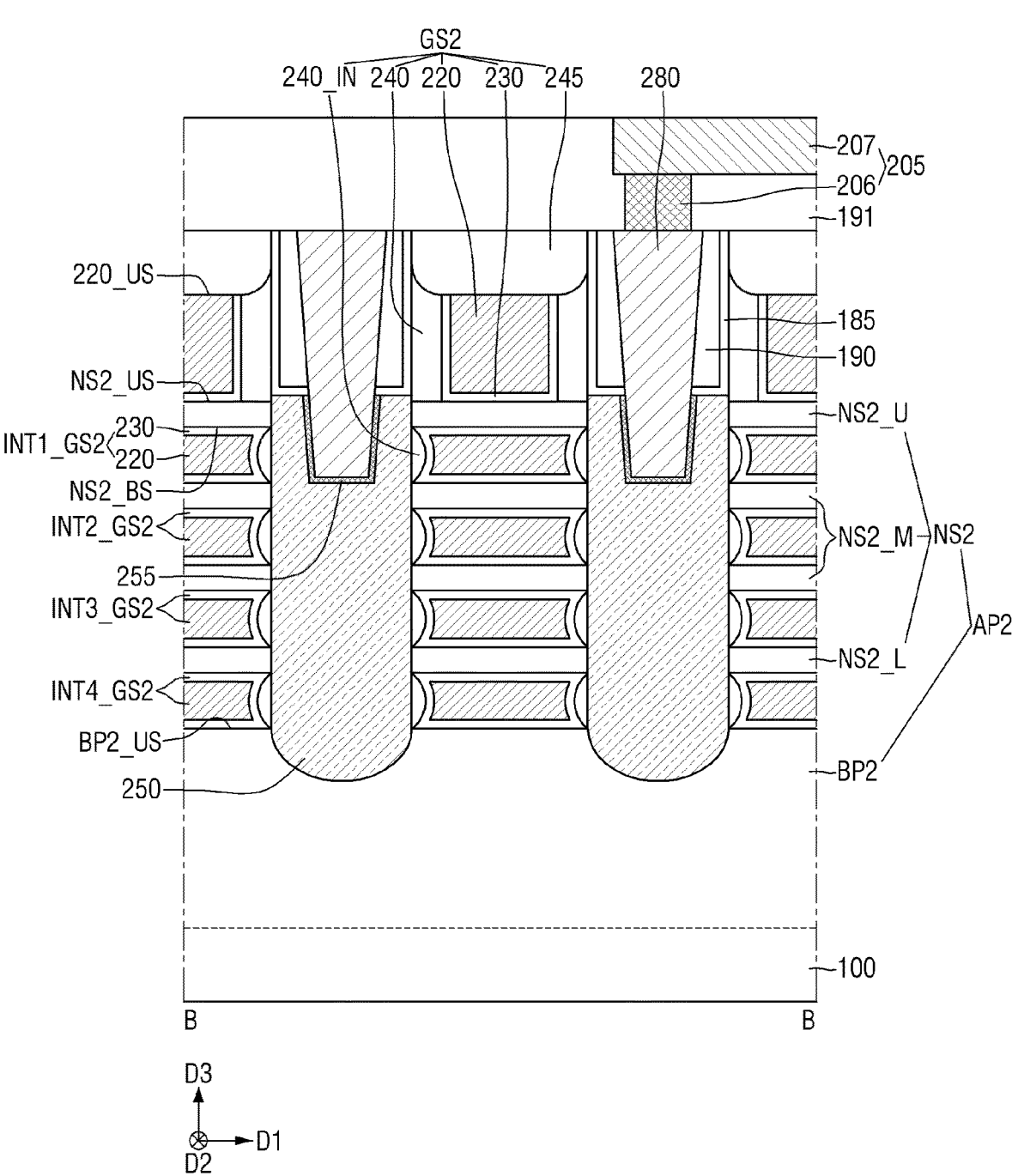

FIGS. 11 and 12 are diagrams for illustrating a semiconductor device according to some embodiments. For convenience of description, following descriptions are based on differences thereof from those as set forth above with reference to FIGS. 1 to 5.

Referring to FIG. 11 and FIG. 12, in the semiconductor device according to some embodiments, the first gate structure GS1 may further include a plurality of first inner spacers 140_IN. The second gate structure GS2 may further include a plurality of second inner spacers 240_IN.

The first inner spacers 140_IN may be respectively between the first sheet patterns NS1 adjacent to each other in the third direction D3 and between the first lower pattern BP1 and the first sheet pattern NS1. The first inner spacers 140_IN may be respectively between the upper surface BP1_US of the first lower pattern and the bottom surface NS1_BS of the first bottommost sheet pattern, and between the upper surface NS1_US of the first sheet pattern and the bottom surface NS1_BS of the first sheet pattern facing each other in the third direction D3.

The first inner spacers 140_IN may be respectively between the first inner gate structures INT1_GS1, INT2_GS1, and INT3_GS1 and the first source/drain pattern 150. The first inner gate structures INT1_GS1, INT2_GS1, and INT3_GS1 may not come into contact with the first source/drain pattern 150.

The second inner spacers 240_IN may be respectively between the second sheet patterns NS2 adjacent to each other in the third direction D3 and between the second lower pattern BP2 and the second sheet pattern NS2. The second inner spacers 240_IN may be respectively between the upper surface BP2_US of the second lower pattern and the bottom surface NS2_BS of the second bottommost sheet pattern, and between the upper surface NS2_US of the second sheet pattern and the bottom surface NS2_BS of the second sheet pattern facing each other in the third direction D3.

The second inner spacers 240_IN may be respectively between the second inner gate structure INT1_GS2, INT2_GS2, INT3_GS2, and INT4_GS2 and the second source/drain pattern 250. The second inner gate structure INT1_GS2, INT2_GS2, INT3_GS2, and INT4_GS2 may not contact the second source/drain pattern 250.

In an implementation, one of the first gate structure GS1 and the second gate structure GS2 may not include an inner spacer.

FIGS. 13 to 16 are diagrams for illustrating a semiconductor devices according to some embodiments.

Figure 13:
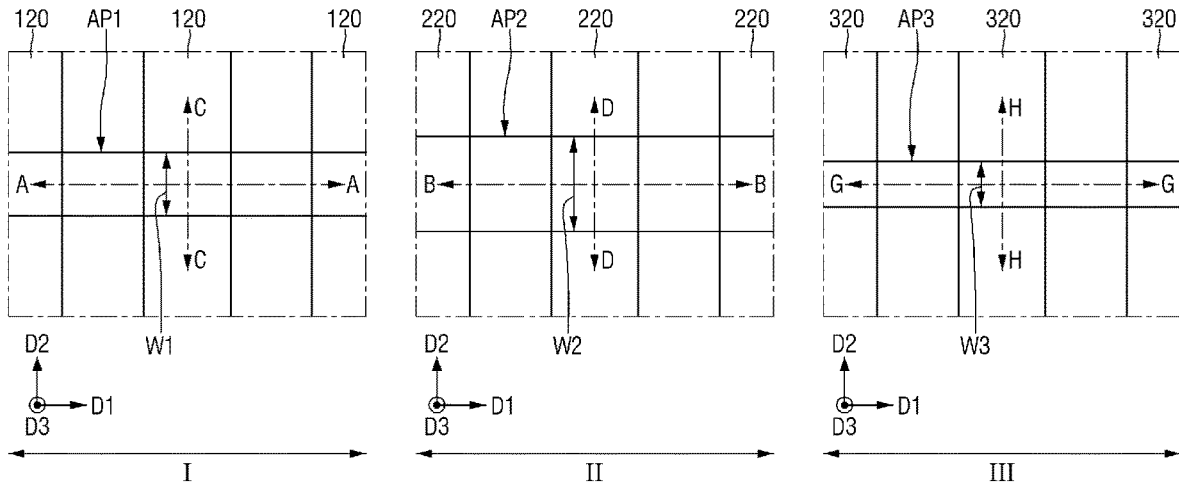
FIGS. 13 to 16 are diagrams for illustrating a semiconductor devices according to some embodiments.
Figure 14:
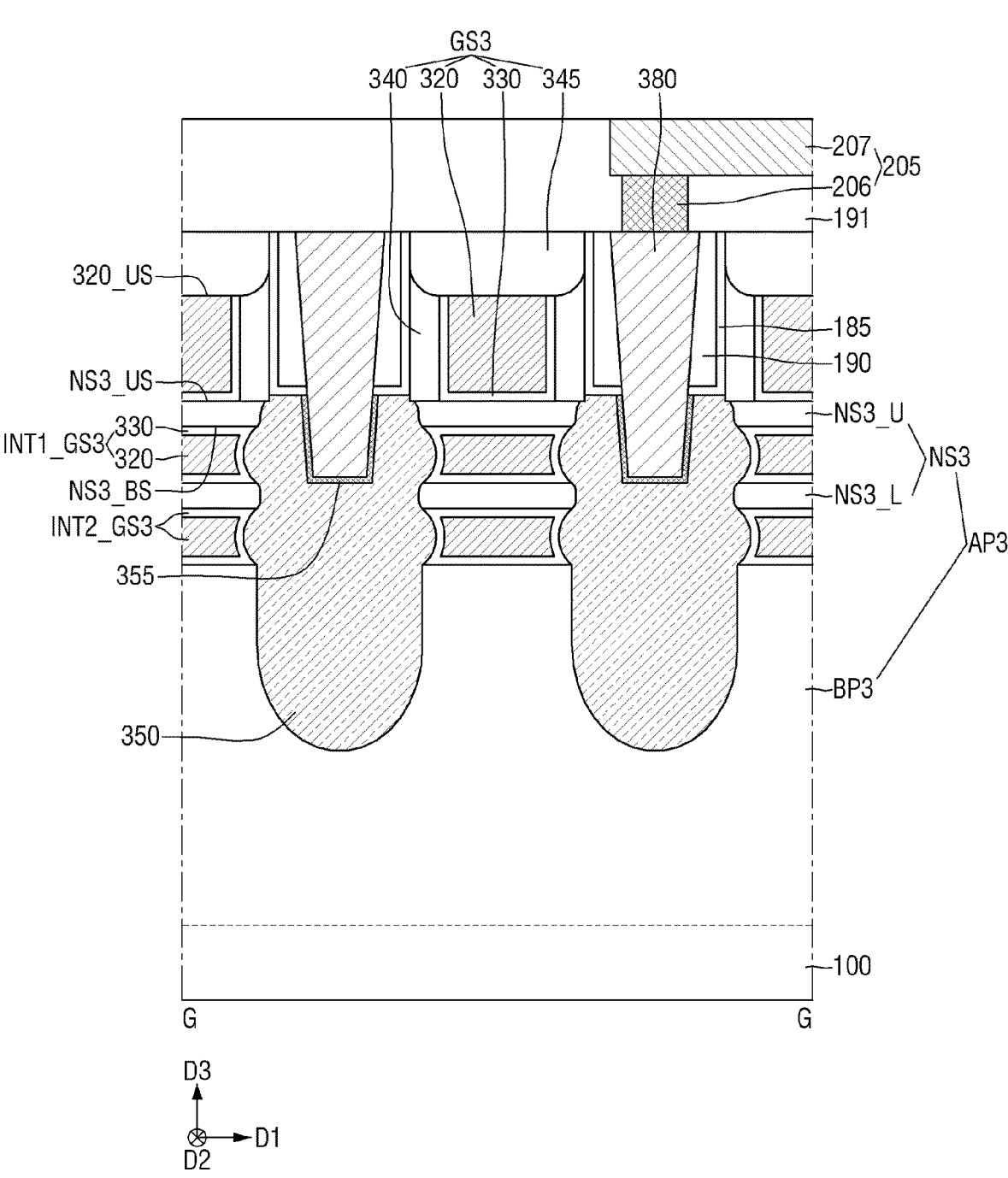
Figure 15:
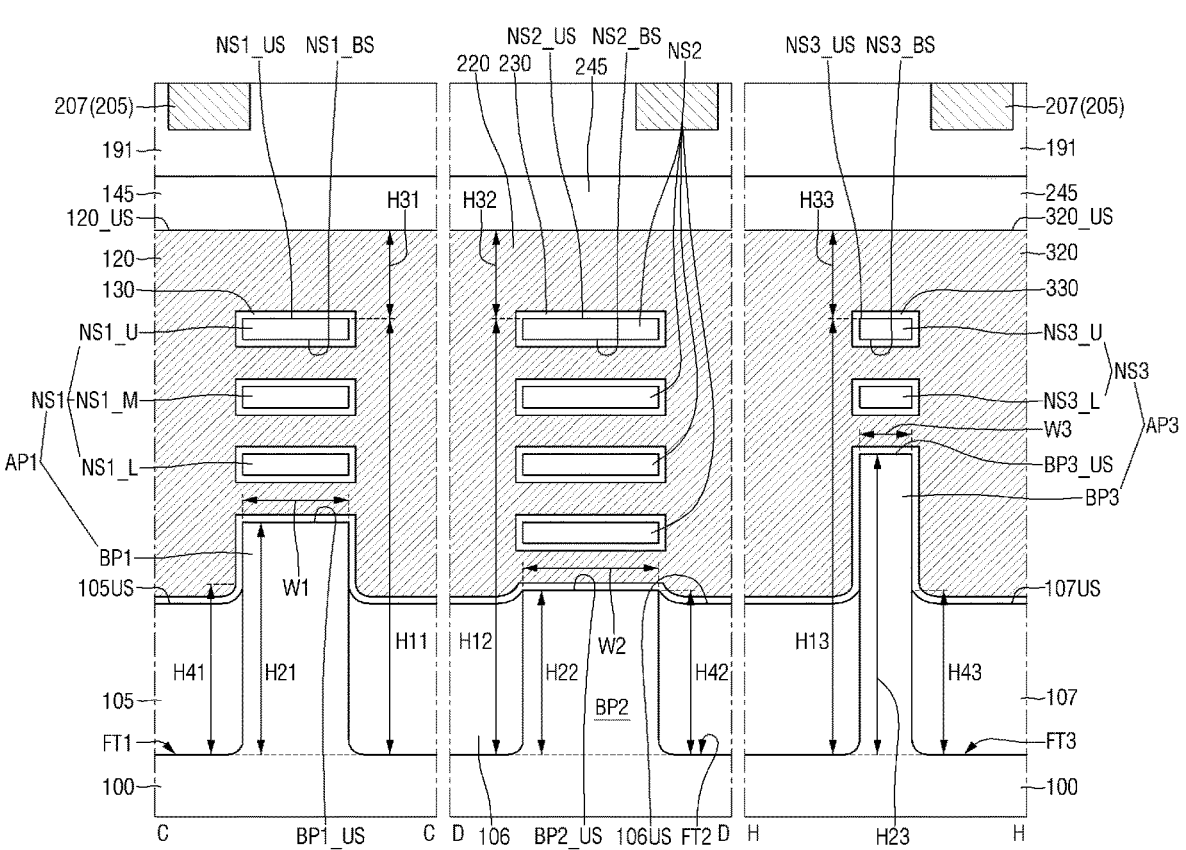
Figure 16:
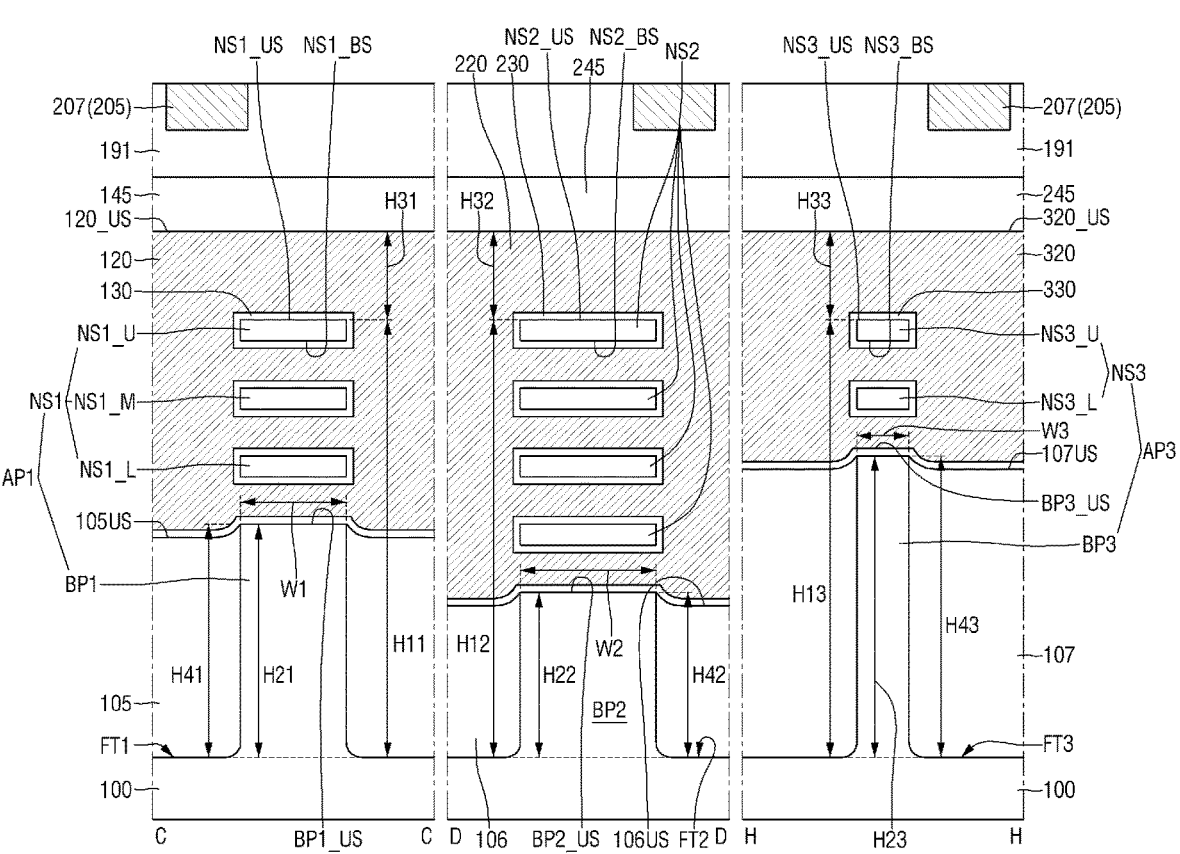

For reference, FIG. 13 is an illustrative layout diagram for illustrating a semiconductor device according to some embodiments. FIG. 14 is a cross-sectional view taken along G-G of FIG. 13. FIG. 15 and FIG. 16 are cross-sectional views taken along C-C, D-D and H-H of FIG. 13, respectively.

Further, descriptions of the first area I and the second area II in FIG. 13 may be substantially the same as those as set forth above using FIGS. 1 to 7. Therefore, following descriptions are based on contents of a third area III in FIG. 13.

In addition, in the following descriptions, comparison between components included in different areas is made using the first area I and the third area III. However, comparison between components included in the second area II and the third area III may be easily identified using the descriptions using FIGS. 1 to 7.

Referring to FIGS. 13 to 16, the semiconductor device according to some embodiments may further include a third active pattern AP3, a plurality of third gate electrodes 320, and a third source/drain pattern 350.

The substrate 100 may include the first area I, the second area II, and the third area III. In an implementation, the third area III may be adjacent to the first area I and/or the second area II. In an implementation, the third area III may be an area separated from the first area I and the second area II.

In an implementation, at least two of the first area I, the second area II, and the third area III may have the same function. In an implementation, the first area I, the second area II, and the third area III may have different functions.

In an implementation, conductivity types of transistors respectively formed in the first area I, the second area II, and the third area III may be the same as each other. In an implementation, the conductivity types of the transistors respectively in two of the first area I, the second area II and the third area III may be different from the conductivity type of the transistor in the remaining one of the first area I, the second area II and the third area III.

The third lower pattern BP3 may protrude from the substrate 100. The third lower pattern BP3 may extend in the first direction D1. The third lower pattern BP3 may be defined by a third fin trench FT3.

A height H23 of the third lower pattern BP3 may be greater than the height H21 of the first lower pattern BP1. A width W3 in the second direction D2 of an upper surface BP3_US of the third lower pattern may be smaller than the width W1 in the second direction D2 of the upper surface BP1_US of the first lower pattern.

The plurality of third sheet patterns NS3 may be on the upper surface BP3_US of the third lower pattern. The third sheet patterns NS3 may include a third bottommost sheet pattern NS3_L and a third uppermost sheet pattern NS3_U. Each of the third sheet patterns NS3 may include an upper surface NS3_US and a bottom surface NS3_BS.

In an implementation, the number of the third sheet patterns NS3 may be smaller than the number of the first sheet patterns NS1.

The height H11 from the bottom surface of the first fin trench FT1 to the upper surface NS1_US of the first uppermost sheet pattern may be equal to a height H13 from a bottom surface of the third fin trench FT3 to the upper surface NS3_US of the third uppermost sheet pattern. The height from the bottom surface of the first fin trench FT1 to the bottom surface NS1_BS of the first bottommost sheet pattern may be smaller than a height from the bottom surface of the third fin trench FT3 to the bottom surface NS3_BS of the third bottommost sheet pattern.

The third lower pattern BP3 may include the same material as that of the first lower pattern BP1. The third sheet pattern NS3 may include the same material as that of the first sheet pattern NS3.

A third field insulating film 107 may be on the substrate 100. The third field insulating film 107 may be on a sidewall of the third lower pattern BP3. The third field insulating film 107 may fill the third fin trench FT3.

In FIG. 15, the height H41 from the bottom surface of the first fin trench FT1 to the upper surface 105US of the first field insulating film may be equal to a height H43 from the bottom surface of the third fin trench FT3 to the upper surface 107US of the third field insulating film.

In FIG. 16, the height H41 from the bottom surface of the first fin trench FT1 to the upper surface 105US of the first field insulating film may be smaller than the height H43 from the bottom surface of the third fin trench FT3 to the upper surface 107US of the third field insulating film.

The plurality of third gate structures GS3 may be on the substrate 100. Each of the third gate structures GS3 may extend in the second direction D2. The third gate structures GS3 may be spaced apart from each other in the first direction D1.

The third gate structure GS3 may be on the third active pattern AP3. The third gate structure GS3 may intersect the third active pattern AP3. The third gate structure GS3 may intersect the third lower pattern BP3. The third gate structure GS3 may surround each of the third sheet patterns NS3. The third gate structure GS3 may include, e.g., a third gate electrode 320, a third gate insulating film 330, a third gate spacer 340 and a third gate capping pattern 345.

The third gate structures GS3 may include a plurality of third inner gate structures INT1_GS3, and INT2_GS3 respectively between the third sheet patterns NS3 adjacent to each other in the third direction D3 and between the third lower pattern BP3 and the third sheet pattern NS3.

The third gate electrode 320 may be on the third lower pattern BP3. The third gate electrode 320 may intersect the third lower pattern BP3. The third gate electrode 320 may surround the third sheet pattern NS3.

The height H31 from the upper surface NS1_US of the first uppermost sheet pattern to the upper surface 120_US of the first gate electrode may be equal to a height H33 from the upper surface NS3_US of the third uppermost sheet pattern to an upper surface 320 US of the third gate electrode.

The height H11+H31 from the bottom surface of the first fin trench FT1 to the upper surface 120_US of the first gate electrode may be equal to a height H13+H33 from the bottom surface of the third fin trench FT3 to the upper surface 320 US of the third gate electrode.

The height H11+H31−H21 from the upper surface BP1_US of the first lower pattern to the upper surface 120_US of the first gate electrode may be greater than a height H13+H33−H23 from the upper surface BP3_US of the third lower pattern to the upper surface 320 US of the third gate electrode.

The third gate insulating film 330 may extend along an upper surface of the third field insulating film 107, and the upper surface BP3_US of the third lower pattern. The third gate insulating film 330 may extend along a sidewall of the third gate electrode 320. The third gate insulating film 330 may be along the circumference of the third sheet pattern NS3. The third gate insulating film 330 may include a high-k material having a higher dielectric constant than that of silicon oxide.

The third gate spacer 340 may be on a sidewall of the third gate electrode 320. The third gate capping pattern 345 may be on the third gate electrode 320 and the third gate spacer 340.

The third source/drain pattern 350 may be on the third active pattern AP3. The third source/drain pattern 350 may be on the third lower pattern BP3. The third source/drain pattern 350 may be connected to the plurality of third sheet patterns NS3. The third source/drain pattern 350 may contact the third sheet pattern NS3.

A third source/drain contact 380 may be on the third source/drain pattern 350. The third source/drain contact 380 may be connected to the third source/drain pattern 350. A third contact silicide layer 355 may be between the third source/drain contact 380 and the third source/drain pattern 350.

FIGS. 17 to 24 are diagrams of stages in a semiconductor device manufacturing method according to some embodiments. For reference, FIG. 17 to FIG. 24 are cross-sectional views taken along C-C and D-D of FIG. 1. Hereinafter, the manufacturing method will be described based on the cross-sectional views.

Further, following descriptions are made using the first area I and the second area II. From the following descriptions, one may also understand the method for manufacturing the semiconductor device in the three different areas as described in FIGS. 13 to 16.

Figure 17:
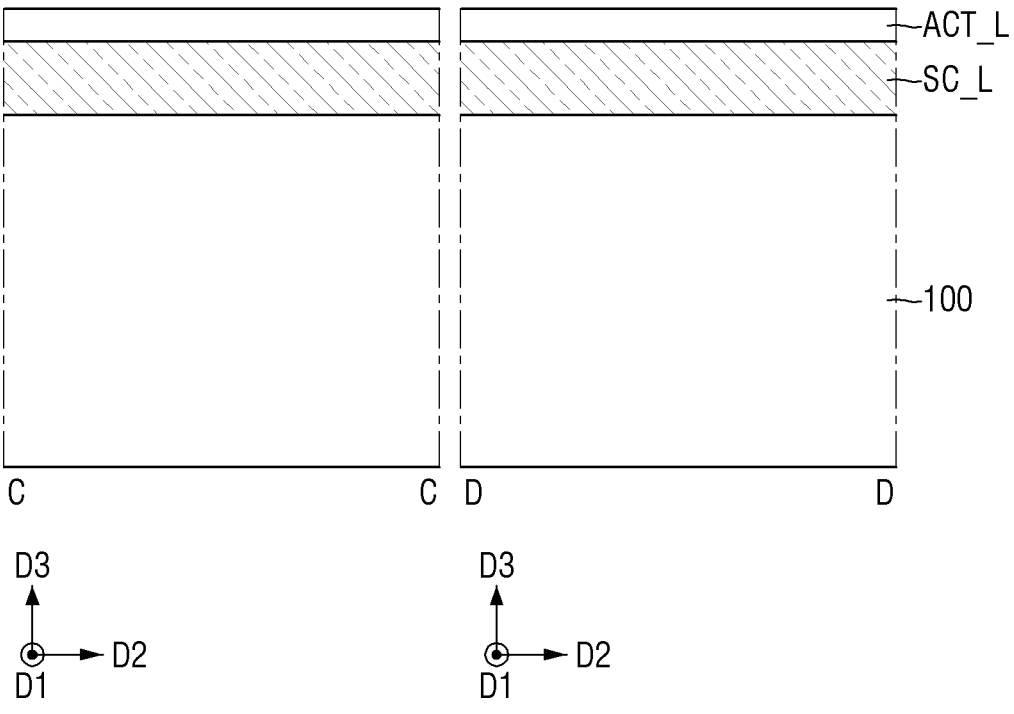
FIGS. 17 to 24 are diagrams of stages in a semiconductor device manufacturing method according to some embodiments.

Referring to FIG. 1 and FIG. 17, a channel film ACT_L and a sacrificial film SC_L may be formed on the substrate 100. The channel film ACT_L and the sacrificial film SC_L may be formed on each of the first area I and the second area II of the substrate 100.

The channel film ACT_L may be formed on the sacrificial film SC_L. Each of the channel film ACT_L and the sacrificial film SC_L may be formed on the substrate 100 using an epitaxial growth scheme. In an implementation, the channel film ACT_L may include silicon, and the sacrificial film SC_L may include silicon germanium.

In an implementation, as illustrated, one pair of channel films ACT_L and one pair of sacrificial films SC_L may be formed on the substrate 100. In an implementation, two or more pairs of channel films ACT_L, and two or more pairs of sacrificial films SC_L may be formed on the substrate 100.

Figure 18:
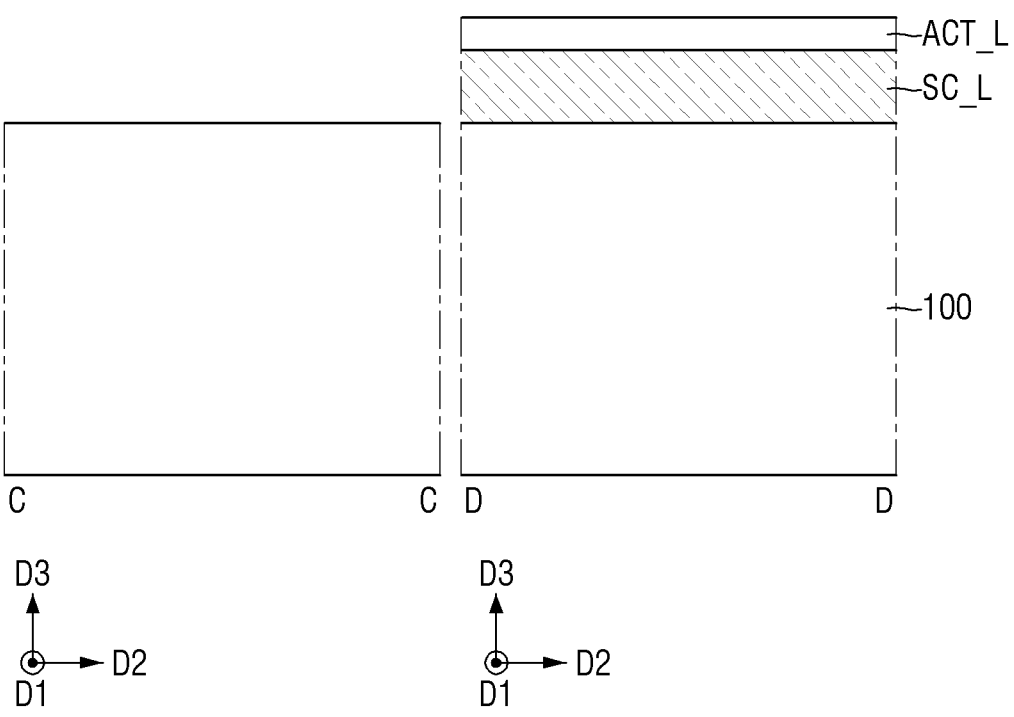

Referring to FIG. 1 and FIG. 18, the channel film ACT_L and the sacrificial film SC_L on the first area I may be removed.

In an implementation, a first mask pattern may be formed on the second area II of the substrate 100. The first mask pattern may be formed on the channel film ACT_L of the second area II. Subsequently, using the first mask pattern as a mask, the channel film ACT_L and the sacrificial film SC_L on the substrate 100 may be etched. Thus, on the first area I, the substrate 100 may be exposed.

Figure 19:
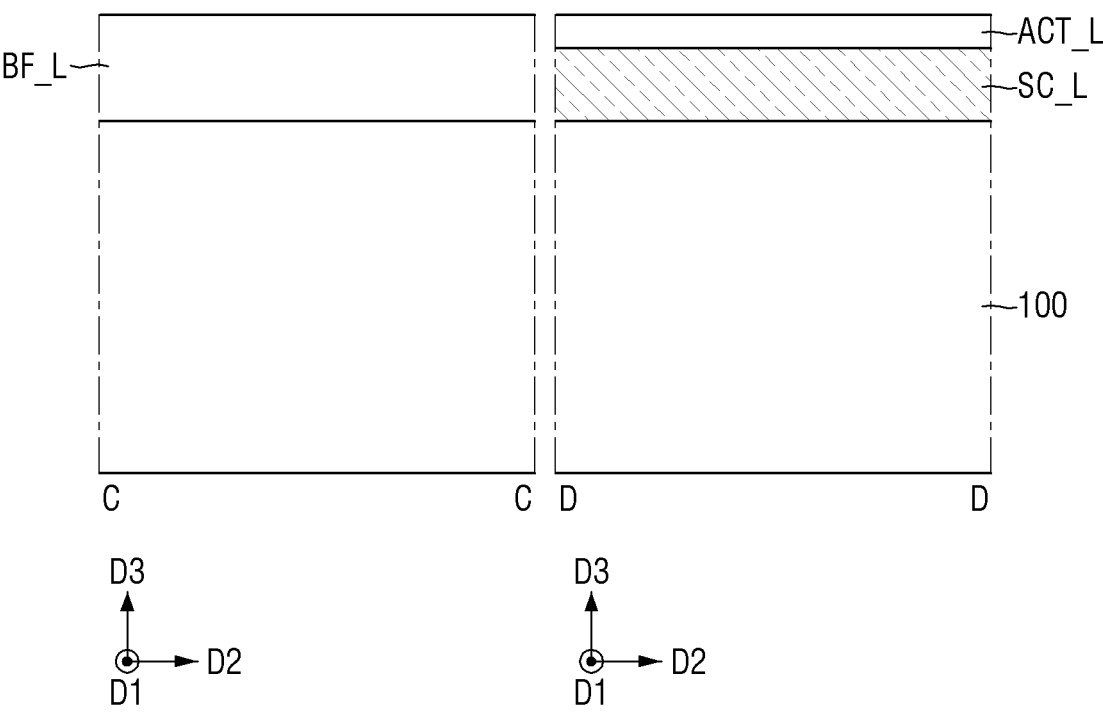

Referring to FIG. 1 and FIG. 19, a lower buffer film BF_L may be formed on the first area I of the substrate 100. The lower buffer film BF_L may be formed on the substrate 100.

The lower buffer film BF_L may be formed using an epitaxial growth scheme. The lower buffer film BF_L may include, e.g., the same material as that of the substrate 100. When the substrate 100 is embodied as a silicon substrate, the lower buffer film BF_L may include silicon.

In an implementation, in a state where the first mask pattern remains, the lower buffer film BF_L may be formed on the substrate 100. The first mask pattern may be on the second area II of the substrate 100, and the lower buffer film BF_L may be formed on the first area I of the substrate 100.

Then, using a planarization process, a portion of the lower buffer film BF_L and the first mask pattern may be removed. Through this, the channel film ACT_L may be exposed in the second area II. An upper surface of the lower buffer film BF_L in the first area I may be coplanar with an upper surface of the channel film ACT_L in the second area II.

Figure 20:
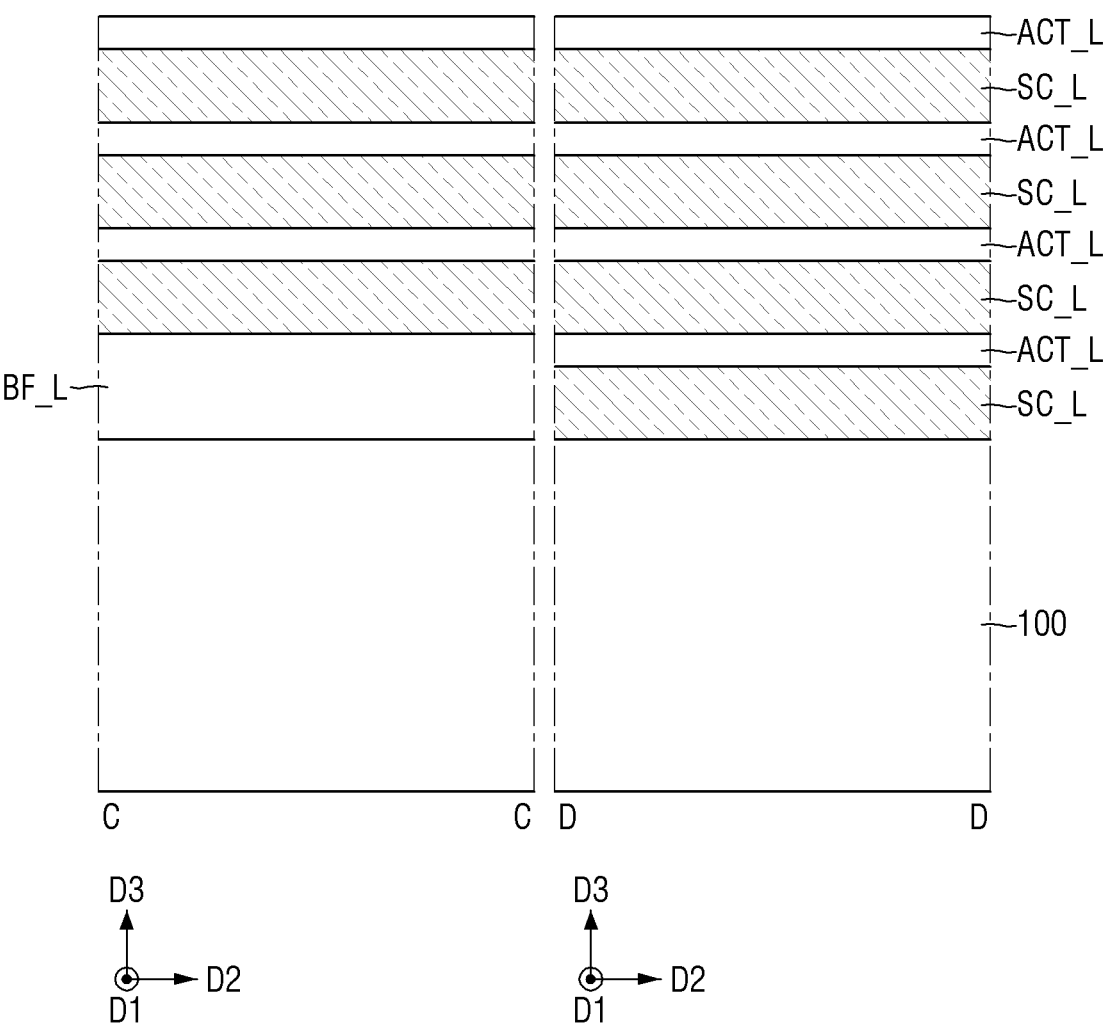

Referring to FIG. 1 and FIG. 20, at least one pair of channel films ACT_L and at least one pair of sacrificial films SC_L may be formed on the substrate 100.

An additional channel film ACT_L and an additional sacrificial film SC_L may be formed on the first area I and the second area II. On the first area I of the substrate 100, the additional channel film ACT_L and the additional sacrificial film SC_L are formed on the lower buffer film BF_L.

Figure 21:
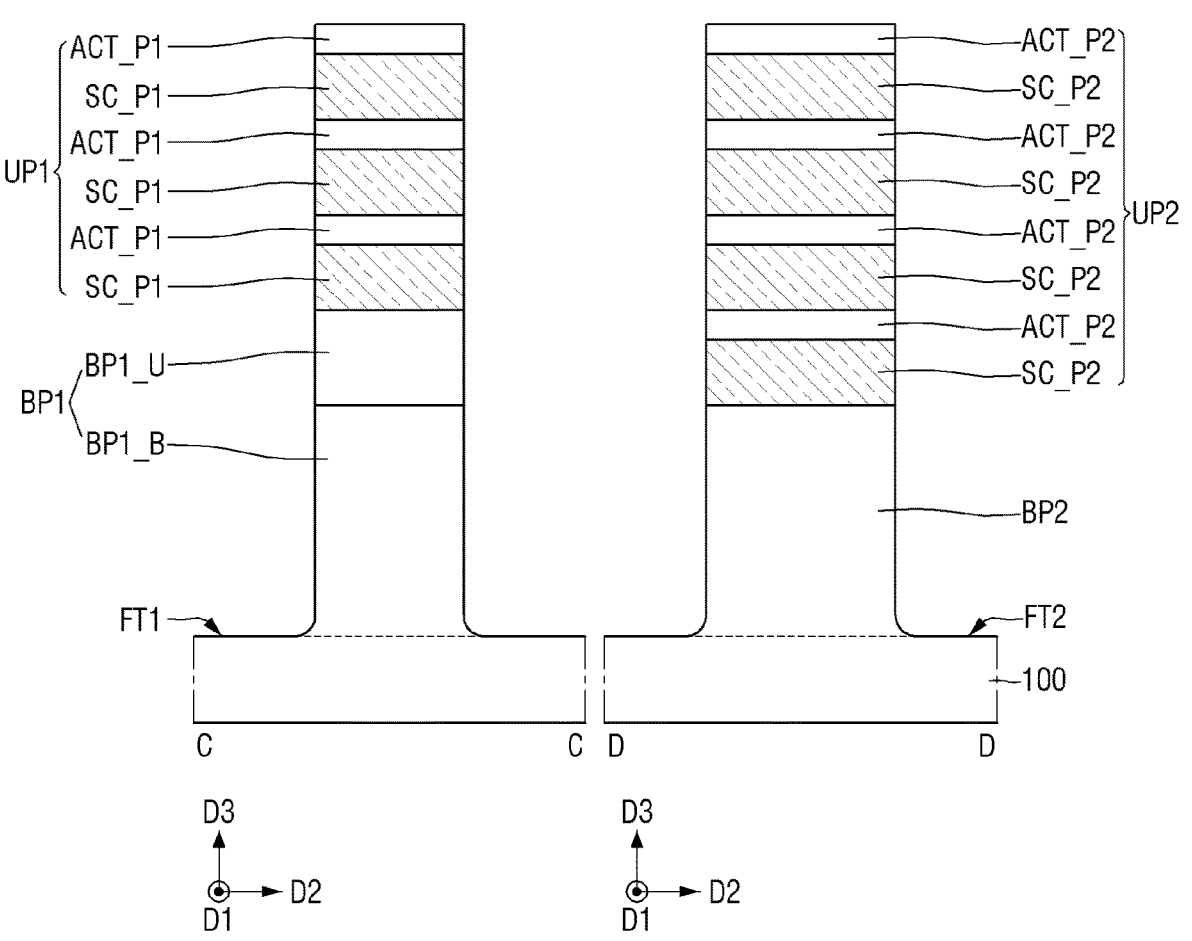

Referring to FIG. 1 and FIG. 21, the first lower pattern BP1 and a first upper pattern UP1 may be formed on the first area I of the substrate 100. The second lower pattern BP2 and a second upper pattern UP2 may be formed on the second area II of the substrate 100.

The first lower pattern BP1 may be formed by patterning a portion of the substrate 100 and the lower buffer layer BF_L. The first upper pattern UP1 may be formed by patterning the channel films ACT_L and the sacrificial films SC_L. The first lower pattern BP1 and the first upper pattern UP1 may be defined by the first fin trench FT1.

The first lower pattern BP1 may include the base lower pattern BP1_B and a buffer lower pattern BP1_U. The base lower pattern BP1_B may be formed by patterning a portion of the substrate 100. The buffer lower pattern BP1_U may be formed by patterning the lower buffer film BF_L. The first upper pattern UP1 may include first channel patterns ACT_P1 and first sacrificial channel patterns SC_P1 alternately stacked on top of each other while being on the first lower pattern BP1.

In an implementation, as illustrated, there may be a boundary surface between the base lower pattern BP1_B and the buffer lower pattern BP1_U. In an implementation, the lower buffer film BF_L may be formed on the substrate 100 using the epitaxial growth scheme, and a boundary surface between the base lower pattern BP1_B and the buffer lower pattern BP1_U may not be distinguished.

The second lower pattern BP2 may be formed by patterning a portion of the substrate 100. The second upper pattern UP2 may be formed by patterning the channel films ACT_L and the sacrificial films SC_L. The second lower pattern BP2 and the second upper pattern UP2 may be defined by the second fin trench FT2. The second upper pattern UP2 may include second channel patterns ACT_P2 and second sacrificial channel patterns SC_P2 alternately stacked on top of each other while being disposed on the second lower pattern BP2.

In an implementation, the first fin trench FT1 may be formed simultaneously with the second fin trench FT2.

Figure 22:
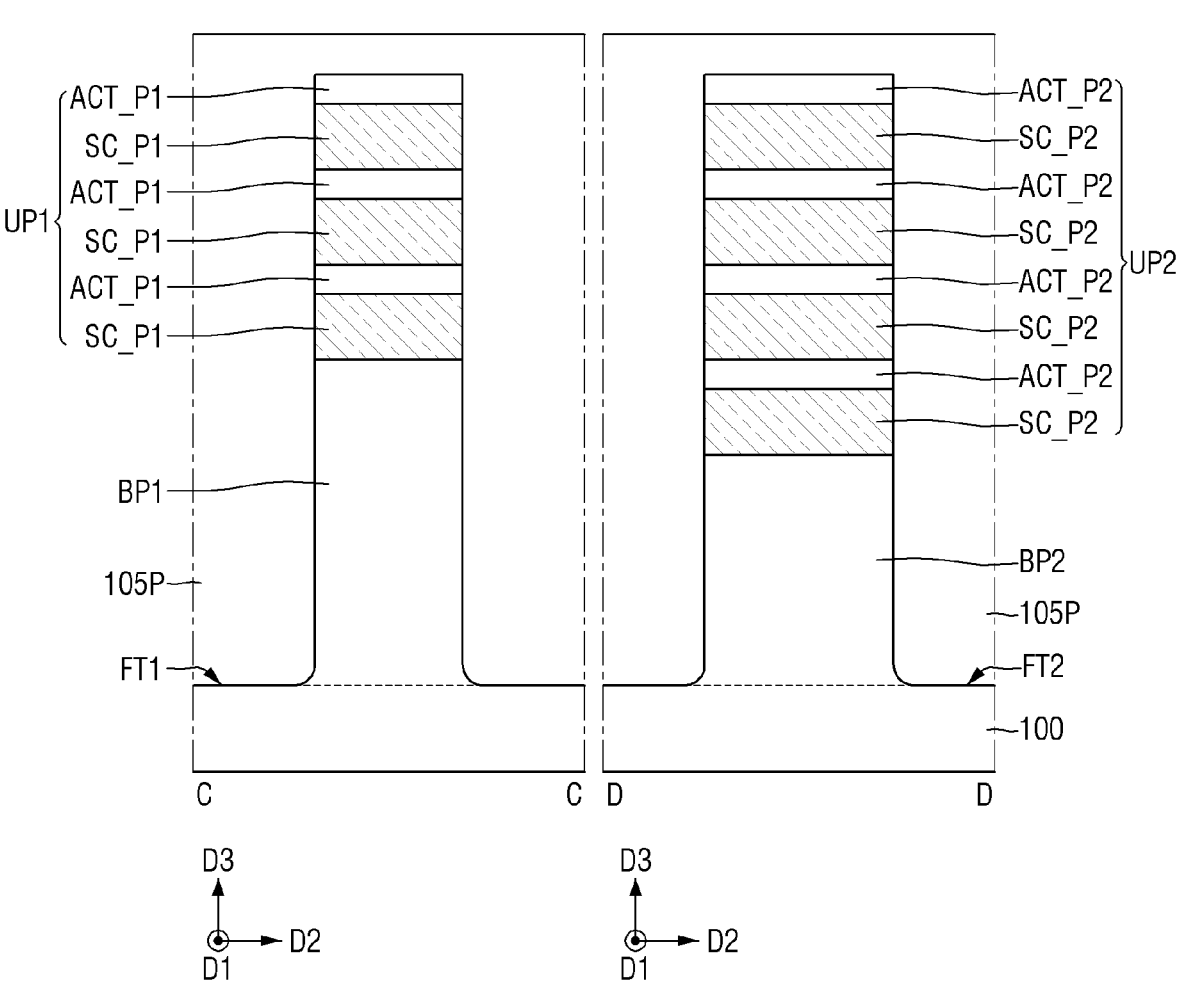

Referring to FIG. 22, a pre-field insulating film 105P may be formed on the substrate 100.

The pre-field insulating film 105P may fill the first fin trench FT1 and the second fin trench FT2. In an implementation, the pre-field insulating film 105P may cover an upper surface of the first upper pattern UP1 and an upper surface of the second upper pattern UP2.

Figure 23:
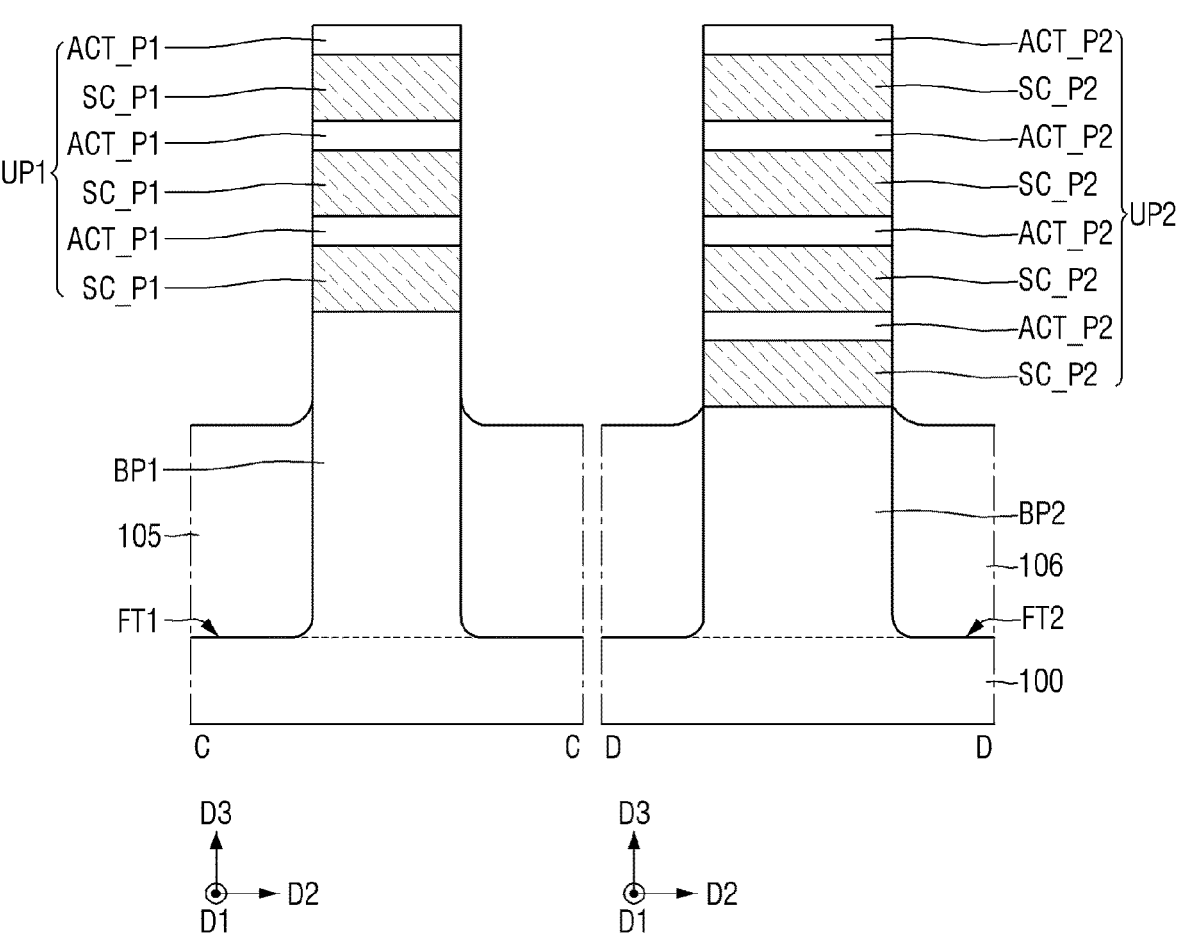

Referring to FIG. 22 and FIG. 23, the first field insulating film 105 and the second field insulating film 106 may be formed by removing a portion of the pre-field insulating film 105P.

The first field insulating film 105 may fill the first fin trench FT1. The first upper pattern UP1 may protrude upwardly beyond the first field insulating film 105.

The second field insulating film 106 may fill the second fin trench FT2. The second upper pattern UP2 may protrude upwardly beyond the second field insulating film 106.

Figure 24:
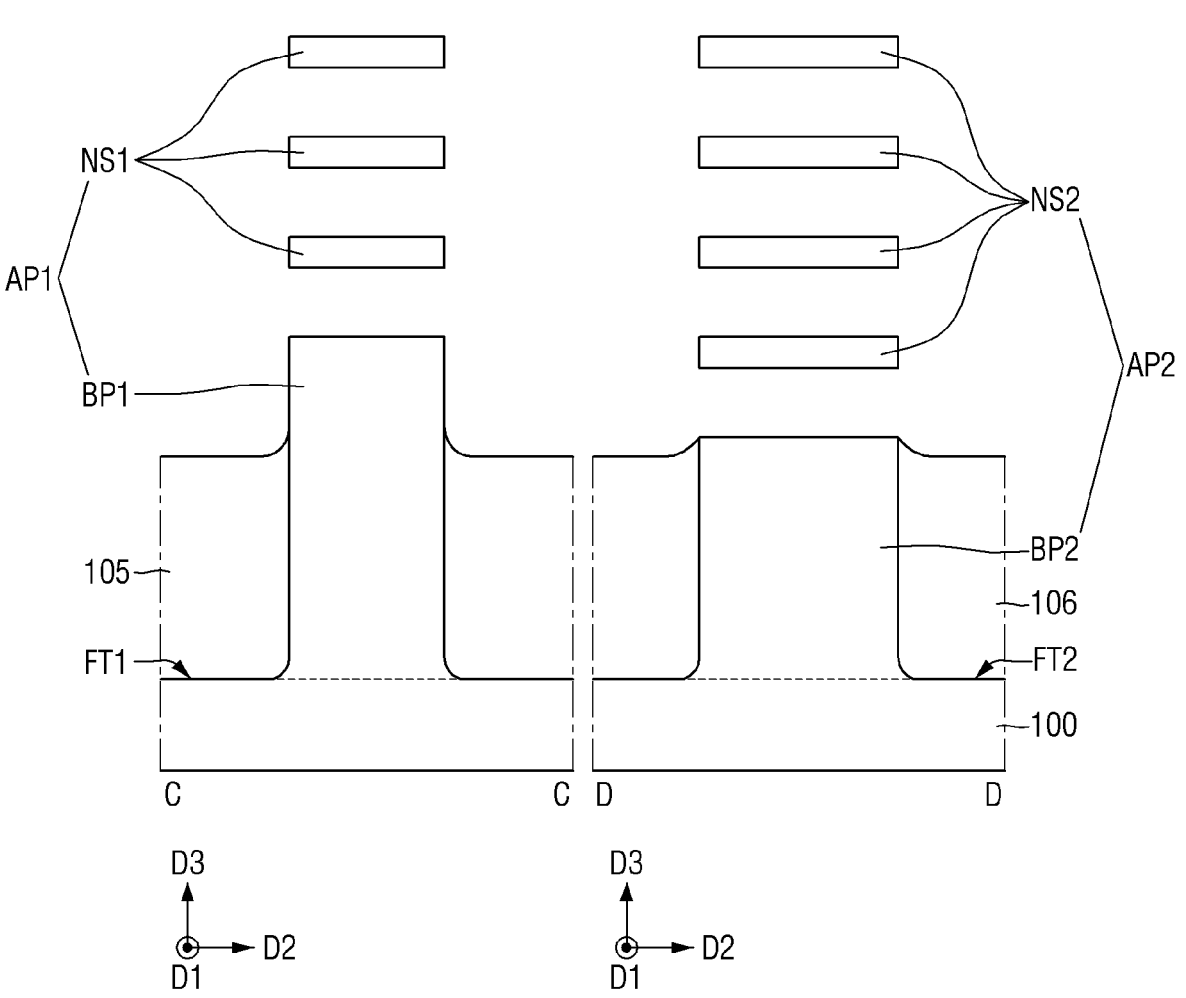

Referring to FIG. 23 and FIG. 24, the first sheet pattern NS1 may be formed on the first lower pattern BP1 by removing the first sacrificial channel pattern SC_P1 of the first upper channel pattern UP1.

The second sheet pattern NS2 may be formed on the second lower pattern BP2 by removing the second sacrificial channel pattern SC_P2 of the second upper pattern UP2.

The first channel patterns ACT_P1 of the first upper pattern UP1 may be the first sheet patterns NS1. The second channel patterns ACT_P2 of the second upper pattern UP2 may be the second sheet patterns NS2.

Then, referring back to FIG. 4, the first and second gate insulating films 130 and 230 and the first and second gate electrodes 120 and 220 may be respectively formed on the first field insulating film 105 and the second field insulating film 106.

FIGS. 25 to 28 are diagrams of stages in a semiconductor device manufacturing method according to some embodiments. For reference, FIG. 25 may be a step of the manufacturing method performed after FIG. 22.

Figure 25:
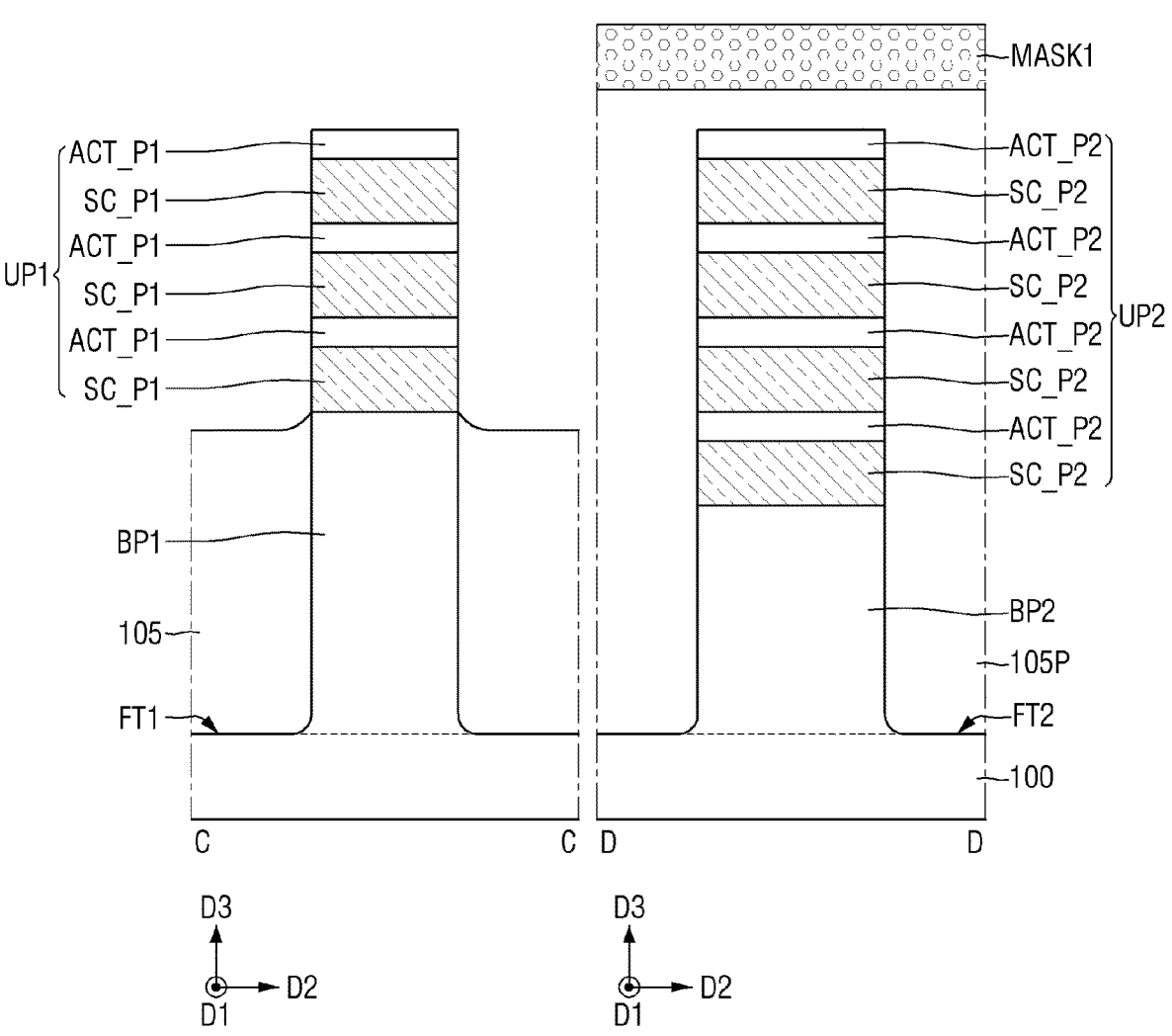
FIGS. 25 to 28 are diagrams of stages in a semiconductor device manufacturing method according to some embodiments.

Referring to FIG. 1 and FIG. 25, a first field mask pattern MASK1 may be formed on the second area II of substrate 100.

The first field mask pattern MASK1 may be formed on the pre-field insulating film 105P. The first field mask pattern MASK1 may expose the pre-field insulating film 105P formed on the first area I.

Subsequently, the first field insulating film 105 may be formed on the substrate 100 by removing a portion of the pre-field insulating film 105P on the first area I.

Figure 26:
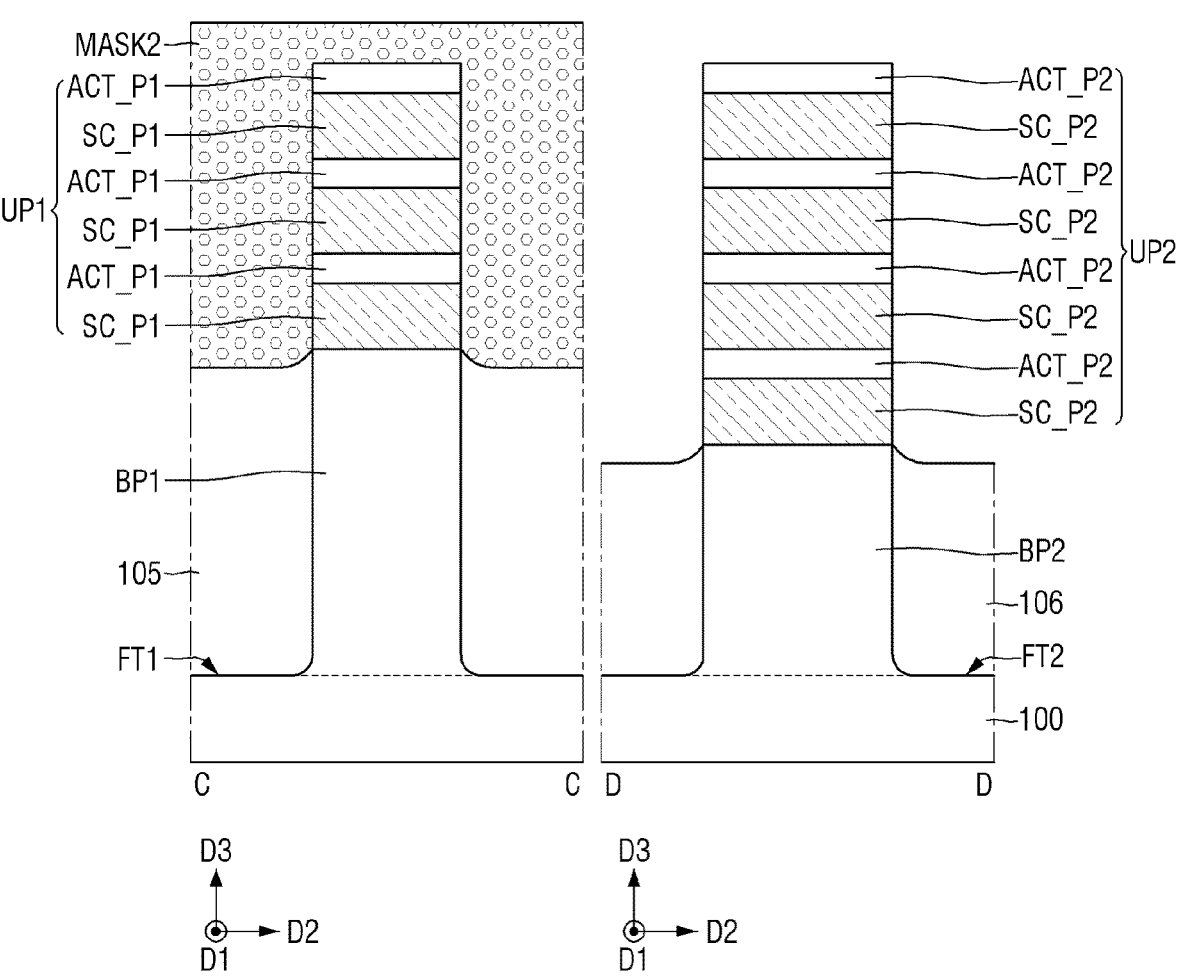

Referring to FIG. 25 and FIG. 26, the first field mask pattern MASK1 is removed.

Subsequently, a second field mask pattern MASK2 may be formed on the first field insulating film 105. The second field mask pattern MASK2 may expose the pre-field insulating film 105P formed on the second area II.

Subsequently, the second field insulating film 106 may be formed on the substrate 100 by removing a portion of the pre-field insulating film 105P on the second area II.

Figure 27:
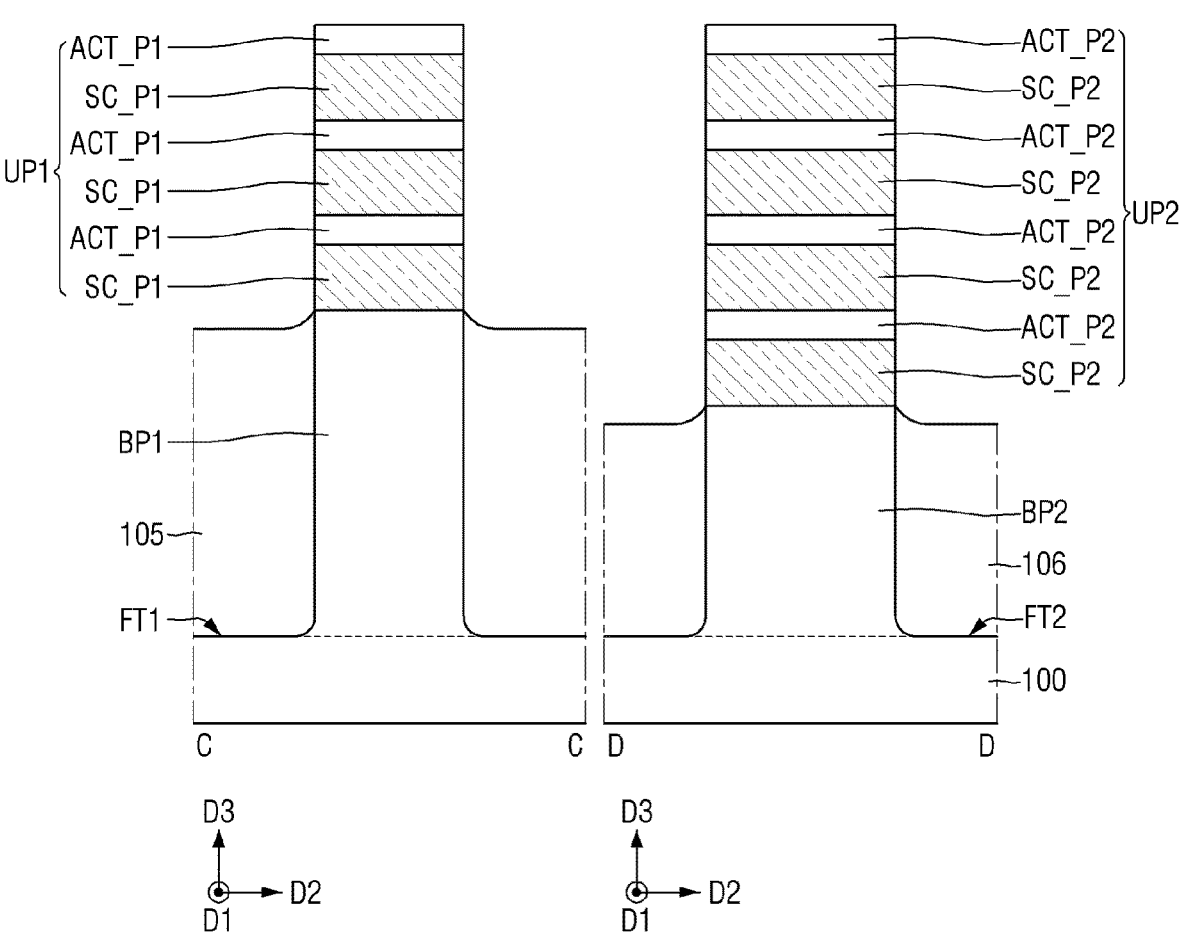

Referring to FIG. 26 and FIG. 27, the second field mask pattern MASK2 is removed. Thus, the first upper pattern UP1 and the second upper pattern UP2 are exposed.

A height of an upper surface of the first field insulating film 105 may be different from a height of an upper surface of the second field insulating film 106.

Figure 28:
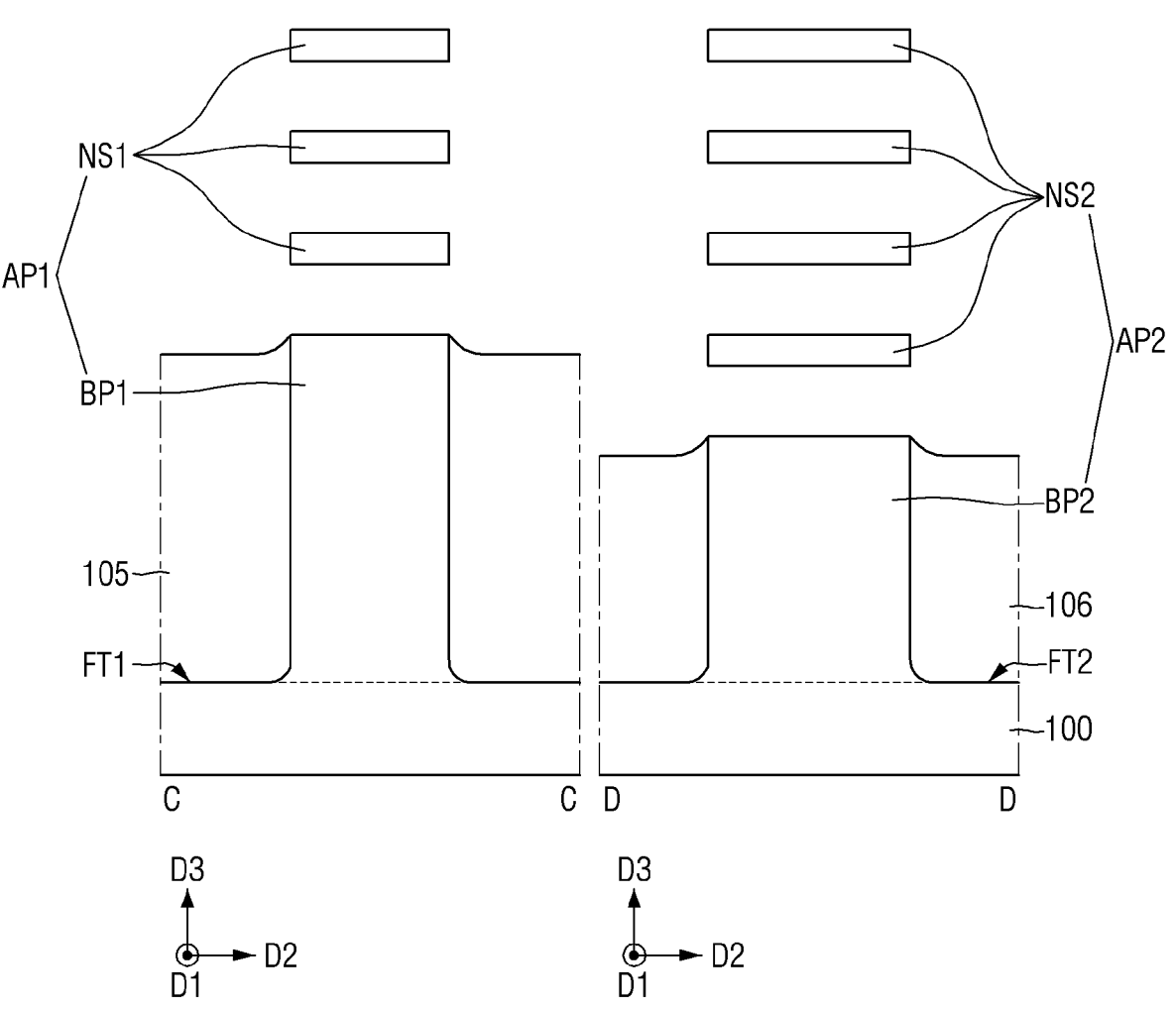

Referring to FIG. 27 and FIG. 28, the first sheet patterns NS1 may be formed on the first lower pattern BP1 by removing the first sacrificial channel patterns SC_P1 of the first upper pattern UP1.

The second sheet patterns NS2 may be formed on the second lower pattern BP2 by removing the second sacrificial channel pattern SC_P2 of the second upper pattern UP2.

FIGS. 29 to 32 are diagrams of stages in a semiconductor device manufacturing method according to some embodiments.

Figure 29:
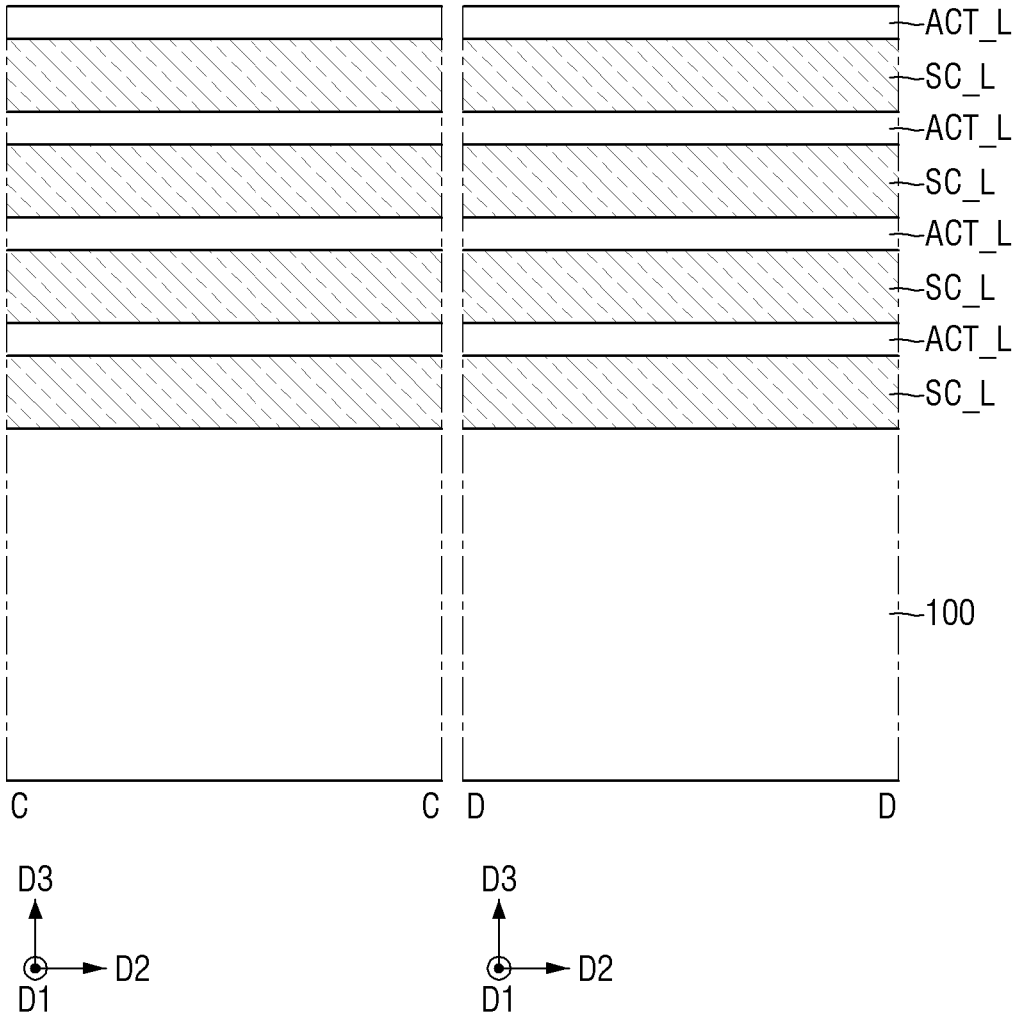
FIGS. 29 to 32 are diagrams of stages in a semiconductor device manufacturing method according to some embodiments.

Referring to FIG. 1 and FIG. 29, two or more pairs of channel films ACT_L and two or more pairs of sacrificial films SC_L may be formed on the substrate 100.

A plurality of channel films ACT_L and a plurality of sacrificial films SC_L may be alternately stacked on top of each other while being disposed on the substrate 100. The plurality of channel films ACT_L and the plurality of sacrificial films SC_L may be formed on each of the first area I and the second area II of the substrate 100.

Figure 30:
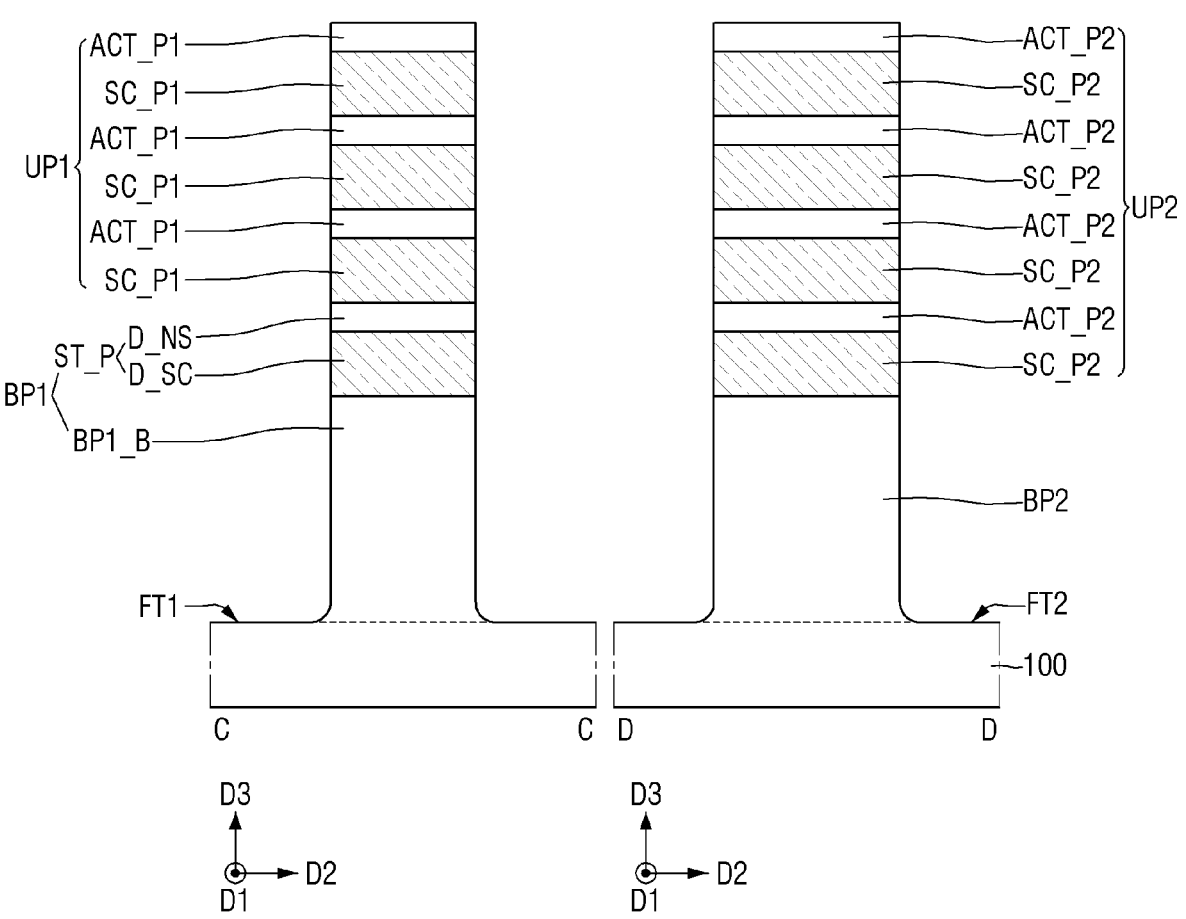

Referring to FIG. 29 and FIG. 30, the first lower pattern BP1 and the first upper pattern UP1 may be formed on the first area I of the substrate 100 by patterning a portion of the substrate 100, the plurality of channel films ACT_L and the plurality of sacrificial films SC_L.

The second lower pattern BP2 and the second upper pattern UP2 may be formed on the second area II of the substrate 100 by patterning a portion of the substrate 100, the plurality of channel films ACT_L, and the plurality of sacrificial films SC_L.

The first lower pattern BP1 may include the base lower pattern BP1_B and the lower stack pattern ST_P. The channel film ACT_L and the sacrificial film SC_L may be patterned to form the lower stack pattern ST_P. The channel film ACT_L may be patterned to form the dummy sheet pattern D_NS. The sacrificial film SC_L may be patterned to form the sacrificial pattern D_SC. The channel films ACT_L and the sacrificial films SC_L may be patterned such that the first upper pattern UP1 may be formed.

The second lower pattern BP2 may be formed by patterning a portion of the substrate 100. The second upper pattern UP2 may be formed by patterning the channel films ACT_L and the sacrificial films SC_L.

Figure 31:
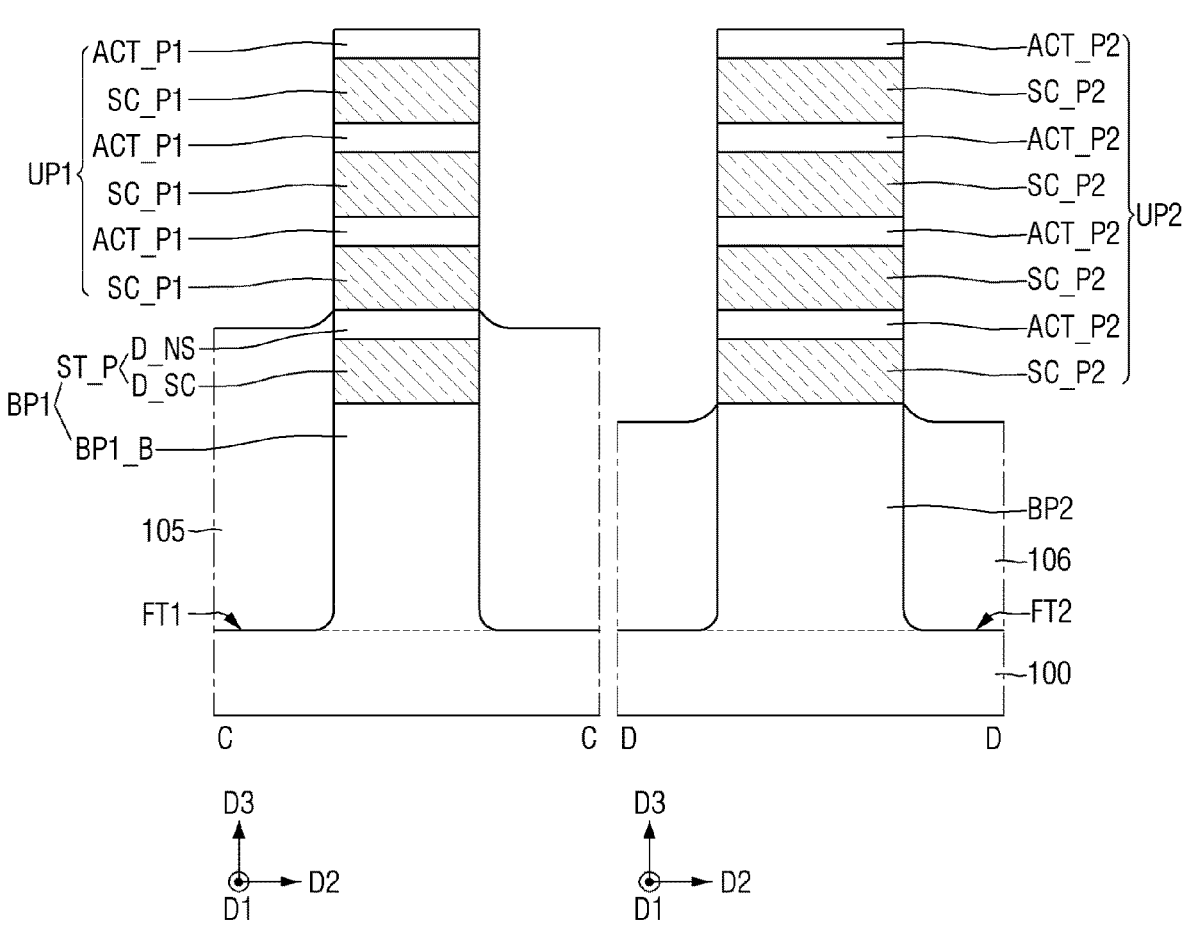

Referring to FIG. 31, on the first area I of the substrate 100, the first field insulating film 105 may be formed. On the second area II of substrate 100, the second field insulating film 106 may be formed.

Using the process as described using FIG. 22 to FIG. 27, the first field insulating film 105 and the second field insulating film 106 may be formed.

Figure 32:
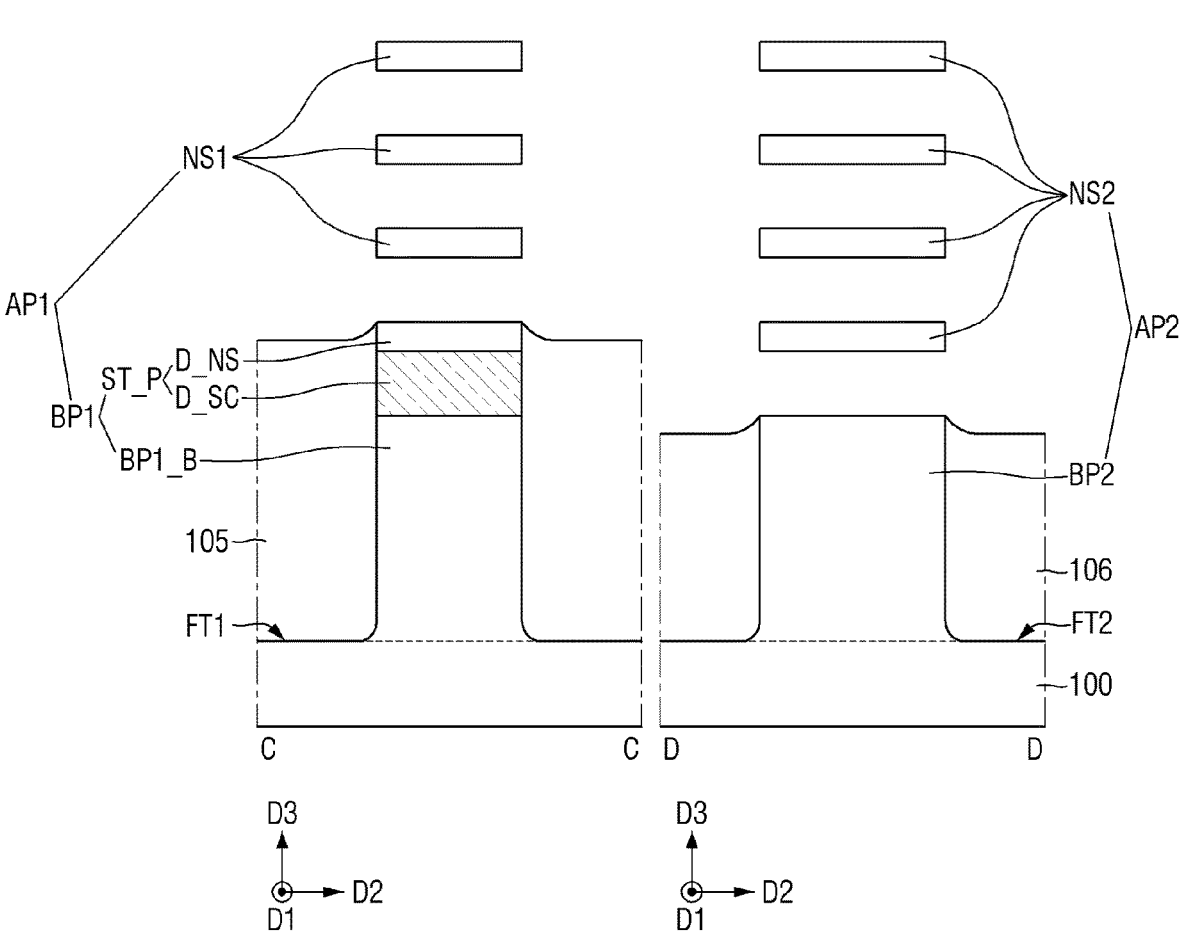

Referring to FIG. 32, the first sheet pattern NS1 may be formed on the first lower pattern BP1 by removing the first sacrificial channel patterns SC_P1 of the first upper pattern UP1.

The second sheet patterns NS2 may be formed on the second lower pattern BP2 by removing the second sacrificial channel patterns SC_P2 of the second upper pattern UP2.

By way of summation and review, a multi-gate transistor may use a three-dimensional channel, and scaling may be easily performed. Further, current control capability of the multi-gate transistor may be improved without increasing a gate length of the multi-gate transistor. Furthermore, the multi-gate transistor may help effectively suppress SCE (short channel effect) in which potential of a channel area is affected by drain voltage.

One or more embodiments may provide a semiconductor device including a MBCFET™ (Multi-Bridge Channel Field Effect) Transistor.

One or more embodiments may provide a semiconductor device capable of improving element performance and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a first active pattern including a first lower pattern extending in a first direction, and a plurality of first sheet patterns spaced apart from the first lower pattern in a vertical direction, the first lower pattern being defined by a first fin trench;

a second active pattern including a second lower pattern extending in the first direction, and a plurality of second sheet patterns spaced apart from the second lower pattern in the vertical direction, a height of the second lower pattern in the vertical direction being smaller than a height of the first lower pattern in the vertical direction, the second lower pattern being defined by a second fin trench;

a first field insulating film filling the first fin trench;

a second field insulating film filling the second fin trench;

a first gate structure on the first lower pattern and including a first gate electrode extending in a second direction that crosses the first direction;

a second gate structure on the second lower pattern and including a second gate electrode extending in the second direction;

a first source/drain pattern on the first lower pattern and connected to the plurality of first sheet patterns; and a second source/drain pattern on the second lower pattern and connected to the plurality of second sheet patterns, wherein;

a width of an upper surface of the first lower pattern in the second direction is different from a width of an upper surface of the second lower pattern in the second direction, a number of first sheet patterns in the plurality of first sheet patterns is smaller than a number of second sheet patterns in the plurality of second sheet patterns, the plurality of first sheet patterns includes a first uppermost sheet pattern, the plurality of second sheet patterns includes a second uppermost sheet pattern, a height from a bottom surface of the first fin trench to an upper surface of the first uppermost sheet pattern in the vertical direction is equal to a height from a bottom surface of the second fin trench to an upper surface of the second uppermost sheet pattern in the vertical direction, and a height from the bottom surface of the first fin trench to an upper surface of the first field insulating film in the vertical direction is equal to a height from the bottom surface of the second fin trench to an upper surface of the second field insulating film in the vertical direction.

2. The semiconductor device as claimed in claim 1, wherein the width of the upper surface of the first lower pattern in the second direction is smaller than the width of the upper surface of the second lower pattern in the second direction.

3. The semiconductor device as claimed in claim 1, wherein:

a height from the bottom surface of the first fin trench to a bottommost surface of the first source/drain pattern in the vertical direction is greater than a height from a bottom surface of the second fin trench to a bottommost surface of the second source/drain pattern in the vertical direction.

4. The semiconductor device as claimed in claim 1, wherein:

a height from the bottom surface of the first fin trench to a bottommost surface of the first source/drain pattern in the vertical direction is equal to a height from a bottom surface of the second fin trench to a bottommost surface of the second source/drain pattern in the vertical direction.

5. The semiconductor device as claimed in claim 1, wherein:

the first lower pattern includes a base lower pattern, and a lower stack pattern on the base lower pattern, the lower stack pattern includes at least one sacrificial pattern, and at least one dummy sheet pattern on the base lower pattern and alternately stacked on top of each other, and the at least one dummy sheet pattern includes the same material as a material of the plurality of second sheet patterns.

6. The semiconductor device as claimed in claim 5, wherein the number of second sheet patterns in the plurality of second sheet patterns is equal to a sum of the number of first sheet patterns in the plurality of first sheet patterns and a number of dummy sheet patterns in the at least one dummy sheet pattern.

* * * * *